(12) United States Patent
You et al.

(10) Patent No.: US 11,646,263 B2
(45) Date of Patent: May 9, 2023

(54) SEMICONDUCTOR DEVICE AND METHOD OF MANUFACTURING SEMICONDUCTOR DEVICE

(71) Applicant: Samsung Electronics Co., Ltd., Suwon-si (KR)

(72) Inventors: Wookyung You, Hwaseong-si (KR); Kyeongbeom Park, Hwaseong-si (KR); Sungbin Park, Suwon-si (KR); Suhyun Park, Suwon-si (KR); Jongmin Baek, Seoul (KR); Jangho Lee, Incheon (KR); Seonghun Lim, Hwaseong-si (KR); Deokyoung Jung, Seoul (KR); Kyuhee Han, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 143 days.

(21) Appl. No.: 17/155,126

(22) Filed: Jan. 22, 2021

(65) Prior Publication Data
US 2021/0391254 A1 Dec. 16, 2021

(30) Foreign Application Priority Data

Jun. 11, 2020 (KR) .................. 10-2020-0070883

(51) Int. Cl.
*H01L 21/00* (2006.01)
*H01L 23/522* (2006.01)
*H01L 23/528* (2006.01)

(52) U.S. Cl.
CPC ........ *H01L 23/5226* (2013.01); *H01L 23/528* (2013.01); *H01L 23/5228* (2013.01)

(58) Field of Classification Search
CPC ............ H01L 23/5226; H01L 23/5228; H01L 23/528
See application file for complete search history.

(56) References Cited

U.S. PATENT DOCUMENTS

| | | | | |
|---|---|---|---|---|
| 5,371,410 | A * | 12/1994 | Chen | H01L 23/485 257/E21.162 |
| 5,466,971 | A * | 11/1995 | Higuchi | H01L 21/76886 257/E29.147 |
| 8,298,902 | B2 | 10/2012 | Dalton et al. | |

(Continued)

FOREIGN PATENT DOCUMENTS

KR 1020210009493 A 1/2021

*Primary Examiner* — Laura M Menz
(74) *Attorney, Agent, or Firm* — Muir Patent Law, PLLC

(57) ABSTRACT

A semiconductor device includes a first insulating layer disposed on a substrate, a first wiring disposed in the first insulating layer, a first insulating barrier layer disposed on the first insulating layer, an etch-stop layer disposed on the first insulating barrier layer and having an area smaller than an area of the first insulating barrier layer in a plan view, a resistive metal pattern disposed on the etch-stop layer, a second insulating barrier layer disposed on the resistive metal pattern, a second insulating layer covering the first and second insulating barrier layers, a second wiring disposed in the second insulating layer, and a first conductive via disposed between the resistive metal pattern and the second wiring to penetrate through the second insulating barrier layer and the second insulating layer and electrically connect the resistive metal pattern and the second wiring.

15 Claims, 22 Drawing Sheets

(56) References Cited

U.S. PATENT DOCUMENTS

| | | | | |
|---|---|---|---|---|
| 8,575,753 B2* | 11/2013 | Choi | H01L 45/1246 | 257/758 |
| 8,592,273 B2* | 11/2013 | Sim | H01L 29/788 | 438/257 |
| 8,766,405 B2 | 7/2014 | Kim | | |
| 8,907,446 B2* | 12/2014 | Summerfelt | H01L 28/20 | 257/296 |
| 9,029,983 B2 | 5/2015 | Chen et al. | | |
| 9,502,284 B2 | 11/2016 | Ali et al. | | |
| 9,728,490 B2* | 8/2017 | Choi | H01L 21/76898 | |
| 10,177,174 B2* | 1/2019 | Hanada | H01L 27/1225 | |
| 10,707,242 B2* | 7/2020 | Hanada | H01L 23/53266 | |
| 11,271,020 B2* | 3/2022 | Hanada | H01L 27/1262 | |
| 11,342,221 B2* | 5/2022 | Hwang | H01L 21/76805 | |
| 2012/0043666 A1* | 2/2012 | Park | H01L 25/0657 | 257/774 |
| 2014/0239445 A1* | 8/2014 | Nishimura | H01L 23/5228 | 257/532 |
| 2016/0141249 A1* | 5/2016 | Kang | H01L 23/552 | 257/751 |
| 2016/0329236 A1* | 11/2016 | Lee | H01L 21/76843 | |
| 2017/0062308 A1* | 3/2017 | Choi | H01L 23/5329 | |
| 2018/0151490 A1* | 5/2018 | Yim | H01L 23/53238 | |
| 2019/0096915 A1* | 3/2019 | Hanada | H01L 21/76877 | |
| 2019/0131228 A1* | 5/2019 | Chun | H01L 24/14 | |
| 2019/0229062 A1* | 7/2019 | Shin | H01L 21/76804 | |
| 2020/0321359 A1* | 10/2020 | Hanada | H01L 27/1225 | |
| 2021/0020497 A1* | 1/2021 | Kang | H01L 23/53295 | |
| 2021/0043556 A1* | 2/2021 | Lee | H01L 21/76807 | |
| 2021/0066123 A1* | 3/2021 | Hwang | H01L 23/481 | |
| 2021/0175230 A1* | 6/2021 | Shin | H01L 21/02603 | |
| 2021/0296211 A1* | 9/2021 | Seo | H01L 23/3128 | |
| 2021/0391254 A1* | 12/2021 | You | H01L 23/53295 | |
| 2022/0068810 A1* | 3/2022 | Lim | H01L 27/0688 | |
| 2022/0148965 A1* | 5/2022 | Lee | H01L 29/7851 | |
| 2022/0149082 A1* | 5/2022 | Hanada | H01L 27/1262 | |
| 2022/0157711 A1* | 5/2022 | Lee | H01L 23/53295 | |
| 2022/0238433 A1* | 7/2022 | Shin | H01L 23/5283 | |

* cited by examiner

SEMICONDUCTOR DEVICE AND METHOD OF MANUFACTURING SEMICONDUCTOR DEVICE

CROSS-REFERENCE TO RELATED APPLICATION(S)

This application claims priority under 35 U.S.C. 119 to Korean Patent Application No. 10-2020-0070883 filed on Jun. 11, 2020 in the Korean Intellectual Property Office, the entire disclosure of which is incorporated herein by reference for all purposes.

BACKGROUND

1. Field

The present inventive concept relates to a semiconductor device and a method of manufacturing the semiconductor device.

2. Description of Related Art

As the demand for high performance, high speed and/or multifunctionality in semiconductor devices increases, the degree of integration of semiconductor devices increases. The size of transistors is shrinking with the trend of high integration in semiconductor devices. As sizes (e.g., widths) of wirings electrically connected to reduced transistors are reduced and distances between wirings are reduced, it may be difficult to implement high-speed operations due to an increase in resistance of wirings and an increase in capacitance between the wirings.

SUMMARY

Example embodiments provide a semiconductor device including an etch-stop layer having improved reliability and a resistive metal pattern formed thereon.

According to an example embodiment, a semiconductor device includes a first insulating layer disposed on a substrate, a first wiring disposed in the first insulating layer, a first insulating barrier layer disposed on the first insulating layer, an etch-stop layer disposed on the first insulating barrier layer and having an area smaller than an area of the first insulating barrier layer in a plan view, a resistive metal pattern disposed on the etch-stop layer, a second insulating barrier layer disposed on the resistive metal pattern, a second insulating layer covering the first and second insulating barrier layers, a second wiring disposed in the second insulating layer, and a first conductive via disposed between the resistive metal pattern and the second wiring to penetrate through the second insulating barrier layer and the second insulating layer and electrically connect the resistive metal pattern and the second wiring.

According to an example embodiment, a semiconductor device includes a first wiring disposed on a substrate, a first insulating barrier layer disposed on the first wiring, a second wiring disposed on the first insulating barrier layer, and a resistive structure disposed between the first insulating barrier layer and the second wiring, and having side surfaces. The resistive structure includes an etch-stop layer disposed on the first insulating barrier layer, and a resistive metal pattern disposed on the etch-stop layer.

According to an example embodiment, a semiconductor device includes a first wiring disposed on a substrate, a first insulating barrier layer disposed on the first wiring, a resistive structure disposed on the first insulating barrier layer and including a resistive metal pattern, an insulating layer disposed on the resistive structure, a second wiring disposed in the insulating layer, and a first conductive via penetrating through the insulating layer and electrically connecting the second wiring and the resistive metal pattern. The resistive structure includes an etch-stop layer disposed between the first insulating barrier layer and the resistive metal pattern, having an area smaller than an area of the first insulating barrier layer in a plan view, and having a thickness in a vertical direction less than a thickness of the resistive metal pattern in the vertical direction, and a second insulating barrier layer disposed on the resistive metal pattern and penetrated by the first conductive via.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiment will be described with reference to the accompanying drawings.

Figure 1A:
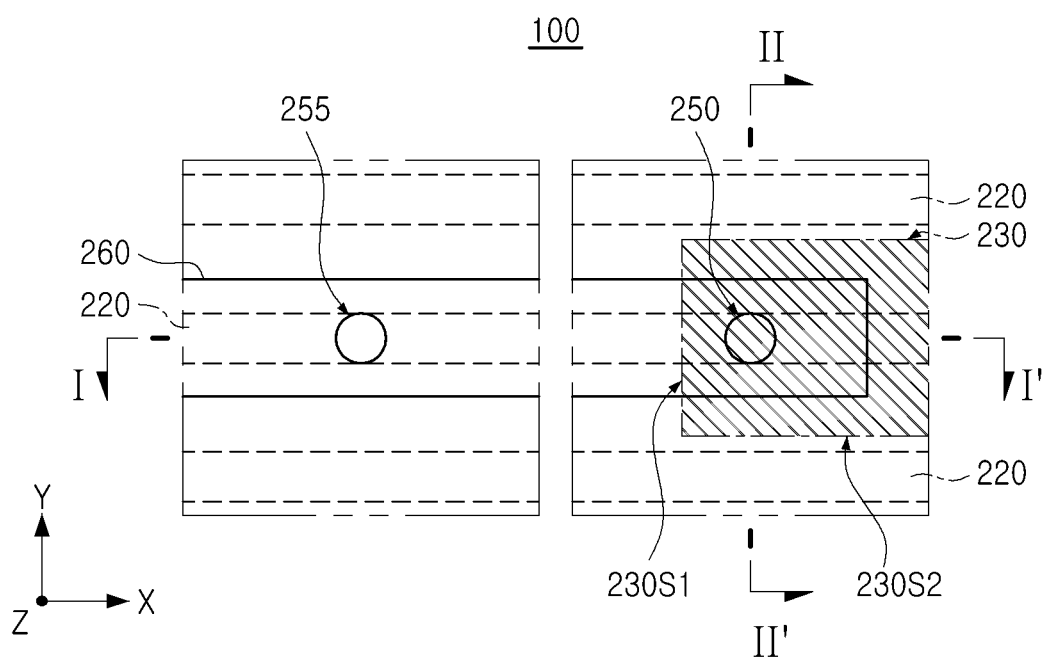
FIG. 1A is a plan view illustrating a semiconductor device according to example embodiments.

FIG. 1A is a plan view illustrating a semiconductor device according to example embodiments.

Figure 1B:
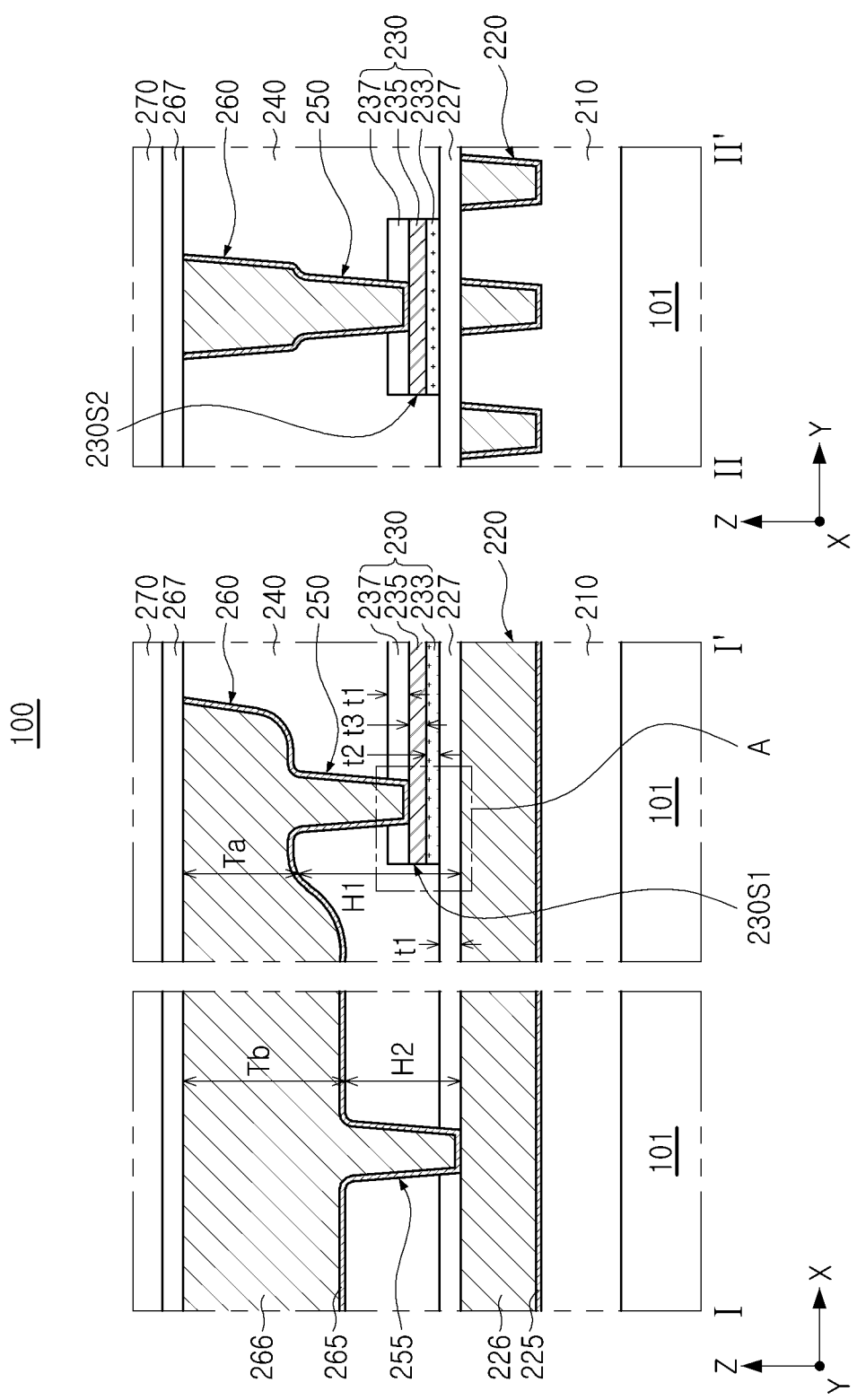
FIG. 1B is a cross-sectional view illustrating a semiconductor device according to example embodiments.

FIG. 1B is a cross-sectional view illustrating a semiconductor device according to example embodiments. FIG. 1B is a cross-sectional view of the semiconductor device of FIG. 1A taken along lines I-I' and II-II'.

Referring to FIGS. 1A and 1B, a semiconductor device 100 may include a substrate 101, a first insulating layer 210, a first wiring 220, a first insulating barrier layer 227, an etch-stop layer 233, a resistive metal pattern 235, a second insulating barrier layer 237, a second insulating layer 240, first and second conductive vias 250 and 255, a second wiring 260, a third insulating barrier layer 267, and a third insulating layer 270. The etch-stop layer 233, the resistive metal pattern 235, and the second insulating barrier layer 237 may form a resistive structure 230.

The substrate 101 may include or may be formed of a semiconductor material, such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a Silicon-On-Insulator (SOI) layer, or a Semiconductor-On-Insulator (SeOI) layer. Transistors constituting an integrated circuit may be disposed on the substrate 101.

The transistors constituting the integrated circuit may include a Planar Metal Oxide Semiconductor FET (MOSFET), a FinFET in which the active region has a fin structure, a gate-all-around transistor or a Multibridge Channel FET (MBCFET™) including a plurality of channels stacked vertically, or a vertical FET (VFET).

The first insulating layer 210 may be disposed on the substrate 101. The first insulating layer 210 may be formed of silicon oxide or a low-k insulating material having a lower dielectric constant than that of silicon oxide. For example, the low dielectric constant (low-k) insulating material may include or may be silicon oxycarbide (SiOC). The first insulating layer 210 may cover transistors constituting the integrated circuit in the semiconductor device 100, and may be an insulating layer in which a wiring structure of a back end of line (BEOL) is disposed. The BEOL may be conductor lines electrically connecting the transistors, resistors and/or other elements constituting the integrated circuit formed below the BEOL. In certain embodiments, the BEOL may include via structures electrically connecting the conductor lines and the above mentioned circuit elements.

Spatially relative terms, such as "beneath," "below," "lower," "above," "upper," "top," "bottom," and the like, may be used herein for ease of description to describe positional relationships. It will be understood that the spatially relative terms encompass different orientations of the device in addition to the orientation depicted in the figures.

The first wiring 220 may be disposed in the first insulating layer 210. The first wiring 220 may extend in, for example, a first direction (an X direction). The semiconductor device 100 may include a plurality of first wirings 220 disposed in the first insulating layer 210. For example, the first wirings 220 may be spaced apart from each other in a second direction (a Y direction). The first wirings 220 may be electrically connected to source/drain regions or gate electrodes of the transistors through a conductive line and a via located therebelow.

The first wiring 220 may include or may be formed of a first conductive barrier 225 and a first conductive line 226. The first conductive barrier 225 may cover/contact a lower/bottom surface and side surfaces of the first conductive line 226. For example, the first conductive line 226 may be formed on the first conductive barrier 225, and the first conductive barrier 225 may contact the bottom surface and the side surfaces of the first conductive line 226.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first conductive line 226 may include or may be formed of a conductive material, for example, at least one of aluminum (Al), copper (Cu), cobalt (Co), ruthenium (Ru), and tungsten (W). The first conductive barrier 225 may include at least one of titanium (Ti), tantalum (Ta), cobalt (Co), titanium nitride (TiN), tantalum nitride (TaN), and graphene. However, the material constituting the first conductive barrier 225 and the first conductive line 226 is not limited to the above material, and may be replaced with another conductive material.

The first insulating barrier layer 227 may be disposed to cover/contact an upper surface of the first insulating layer 210 and an upper surface of the first wiring 220. The first insulating barrier layer 227 may include or may be formed of a silicon-containing material such as silicon nitride (SiN), silicon carbide (SiC), silicon oxycarbide (SiOC), silicon oxynitride (SiON), or silicon carbonitride (SiCN). The first insulating barrier layer 227 may include or may be formed of a metal-containing material such as metal nitride or metal oxide. The first insulating barrier layer 227 may include or may be formed of an aluminum-containing material such as aluminum nitride (AlN), aluminum oxide (AlO), and aluminum oxycarbide (AlOC). In an example embodiment, the first insulating barrier layer 227 may be formed of one layer or a plurality of layers.

The first insulating barrier layer 227 may have a first thickness t1 in a vertical direction, substantially the same as that of the second insulating barrier layer 237. In an example embodiment, the first thickness t1 of the first insulating barrier layer 227 may be greater than 0 Å and may be less than or equal to about 100 Å. In an example embodiment, the first thickness t1 of the first insulating barrier layer 227 may be greater than 0 Å and may be less than or equal to about 80 Å.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The resistive structure 230 may be disposed on the first insulating barrier layer 227. The resistive structure 230 may be disposed below the second wiring 260. The resistive structure 230 may have a planar area smaller than a planar area of the first insulating barrier layer 227. In this case, the planar area may indicate an area of a region in which a component is disposed when the semiconductor device 100 is viewed from above. For example, a planar area in this disclosure may be an area of an object in a plan view. For example, a planar area of an object may be a plan view area of the object. The resistive structure 230 may have a rectangular planar shape or a line/bar shape extending in at least one direction. However, the planar shape of the resistive structure 230 may be variously changed according to example embodiments. For example, the resistive structure 230 may include a bent portion. For example, a planar shape in this disclosure may be a shape of an object in a plan view.

The etch-stop layer 233, the resistive metal pattern 235, and the second insulating barrier layer 237 may each have a planar area smaller than that of the first insulating barrier layer 227. The etch-stop layer 233, the resistive metal pattern 235, and the second insulating barrier layer 237 may have substantially the same planar area.

The etch-stop layer 233 may be disposed on the first insulating barrier layer 227. The etch-stop layer 233 may be disposed between the first insulating barrier layer 227 and the resistive metal pattern 235. The lower surface of the etch-stop layer 233 may contact the upper surface of the first insulating barrier layer 227, and the upper surface of the etch-stop layer 233 may contact the lower surface of the resistive metal pattern 235. A side surface of the etch-stop layer 233 may overlap the first insulating barrier layer 227 in a third direction (a Z direction). The etch-stop layer 233 may have a second thickness t2 in the vertical direction less than the first thickness t1 of the first insulating barrier layer 227. In an example embodiment, the second thickness t2 of the etch-stop layer 233 may be greater than 0 Å and may be less than or equal to about 30 Å.

Figure 8A:
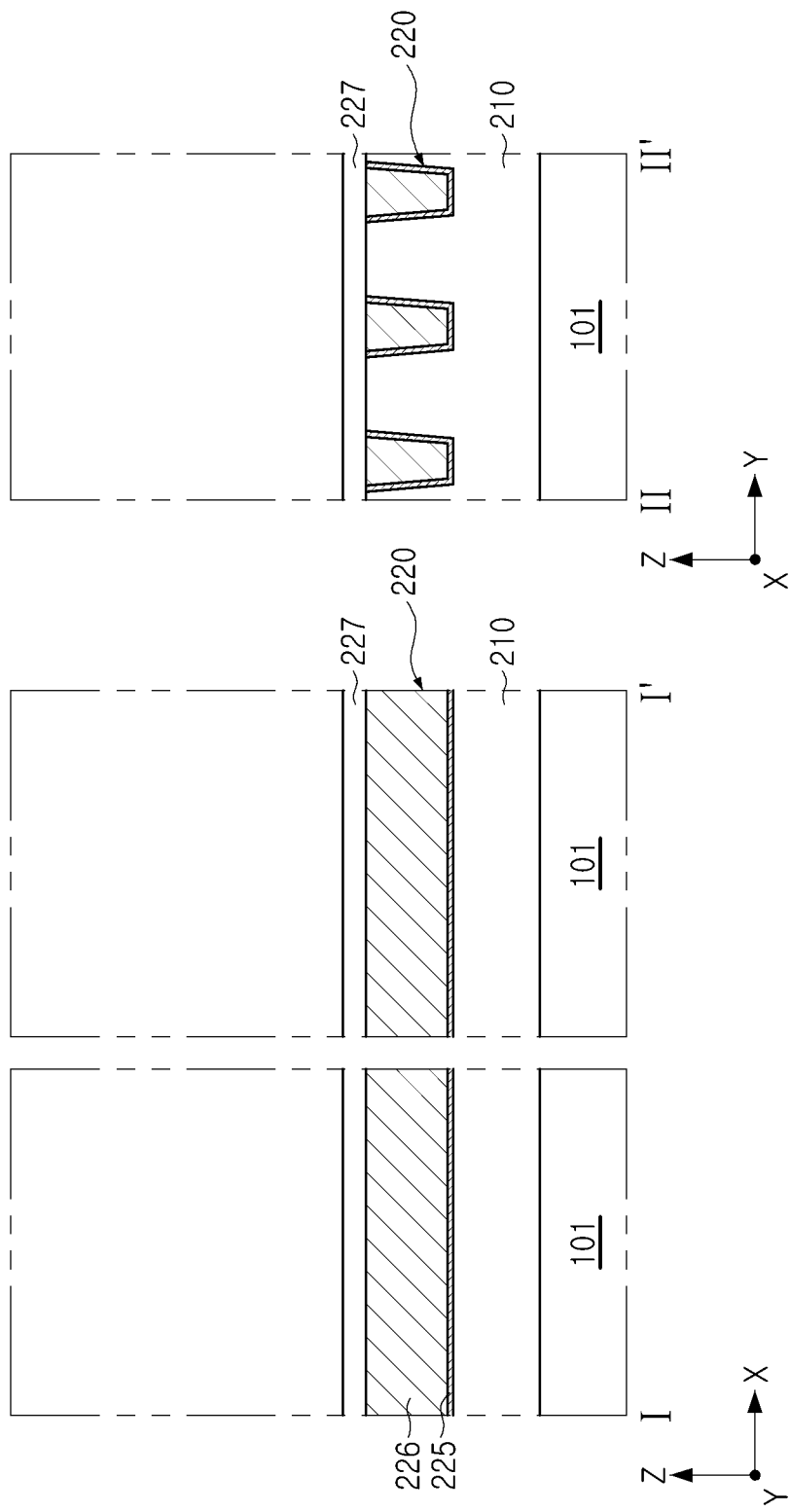
FIGS. 8A to 8E are diagrams illustrating a process sequence to illustrate a method of manufacturing a semiconductor device according to example embodiments.
Figure 8B:
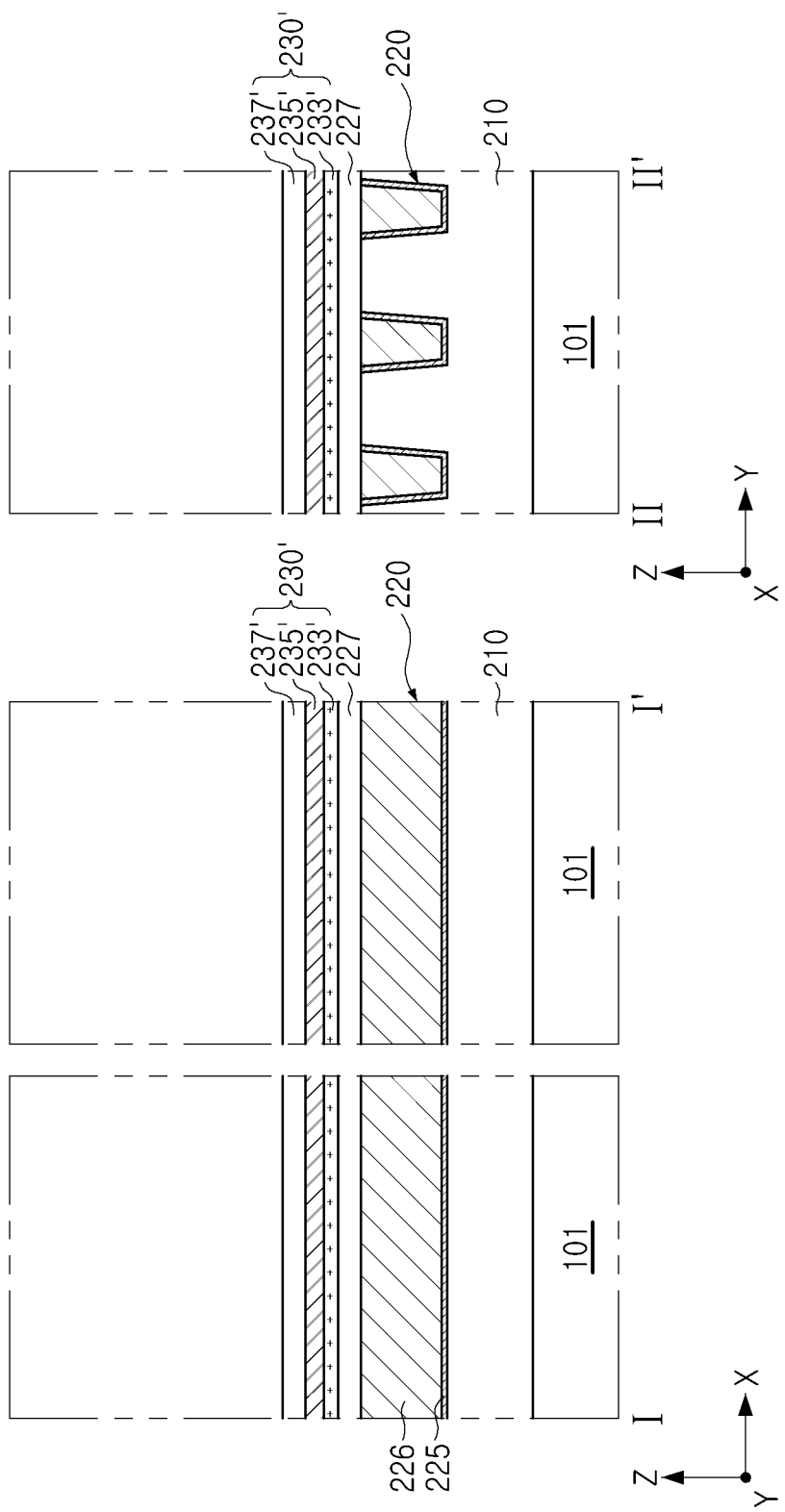
Figure 8C:
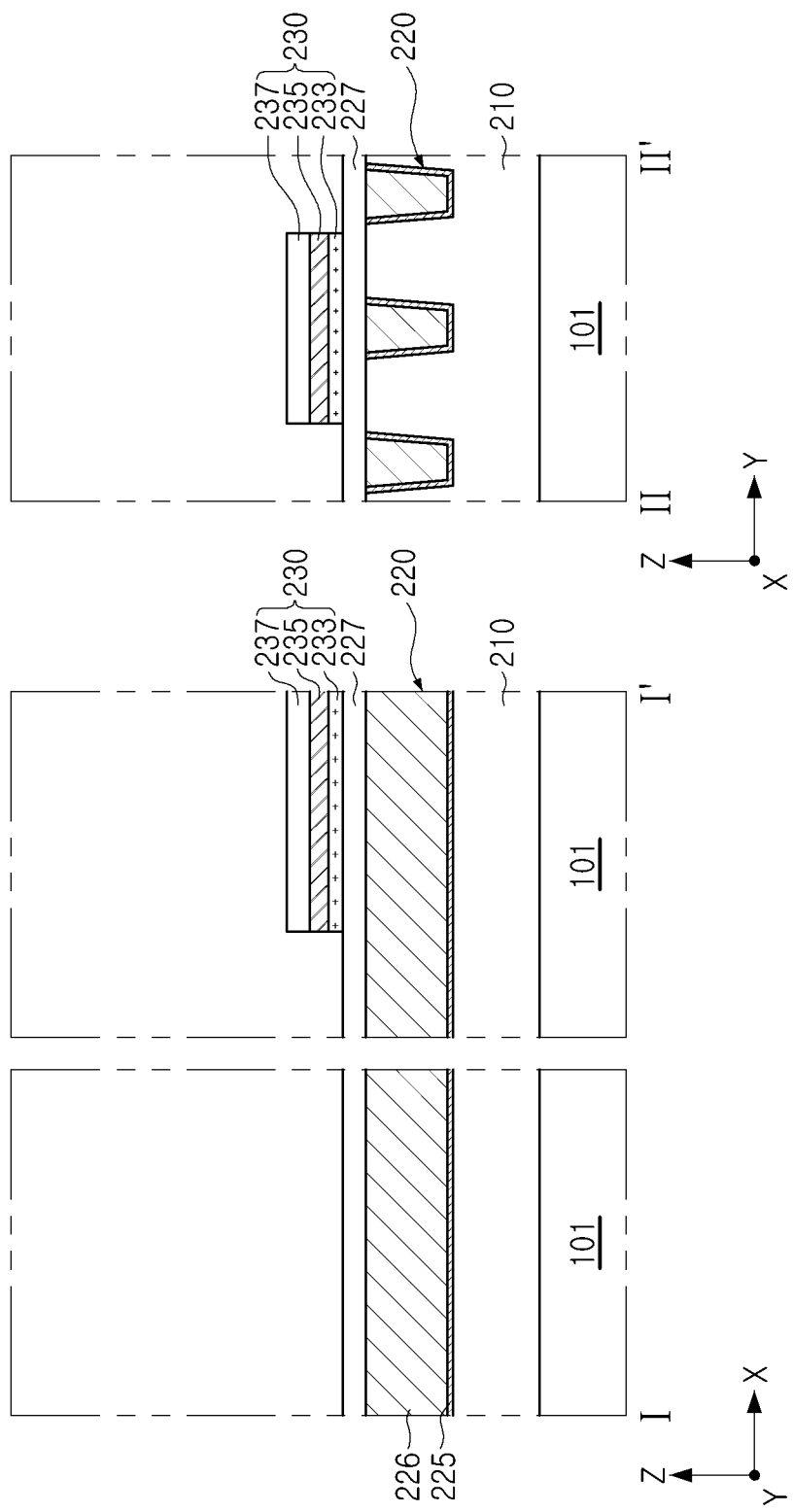

The etch-stop layer 233 may serve as a stopper stopping the etching process so that the upper surface of the first insulating barrier layer 227 is not damaged by and during the etching process for forming the resistive structure 230 (see FIGS. 8B and 8C). Accordingly, the first wiring 220 disposed below the first insulating barrier layer 227 may be protected from moisture, oxygen, or etching gas. For example, undamaged first insulating barrier layer 227 may protect the first wiring 220 disposed under the first barrier layer 227 from moisture, oxygen and/or etching gas. Since the etch-stop layer 233 serves as a stopper, the thickness of the first insulating barrier layer 227 may be significantly reduced.

The etch-stop layer 233 may be formed of a material having etch selectivity with respect to the first insulating barrier layer 227 and the second insulating layer 240. For example, the etch-stop layer 233 may be formed of an insulating material different from the materials forming the first insulating barrier layer 227 and the second insulating layer 240. The etch-stop layer 233 may include or may be formed of aluminum oxide, aluminum nitride, aluminum oxynitride, or a combination thereof. The etch-stop layer 233 may include aluminum (Al) and at least one of titanium (Ti), tantalum (Ta), cobalt (Co), zirconium (Zr), ruthenium (Ru), lanthanum (La), and hafnium (Hf). The etch-stop layer 233 may further include nitrogen (N) and/or carbon (C). For example, the etch-stop layer 233 may include at least one of aluminum oxide (AlOx), aluminum oxynitride (AlON), aluminum oxycarbide (AlOC), aluminum zirconium oxide (AlxZryOz), and aluminum hafnium oxide (AlxHfyOx). For example, the etch-stop layer 233 may include or may be formed of a metal oxide containing aluminum (Al). In an example embodiment, the etch-stop layer 233 may be formed of one layer (e.g., a layer formed of a single, continuous material) or a plurality of layers.

The resistive metal pattern 235 may be disposed on the etch-stop layer 233. The resistive metal pattern 235 may be disposed between the etch-stop layer 233 and the second insulating barrier layer 237. The side surface of the resistive metal pattern 235 may be substantially coplanar with the side surface of the etch-stop layer 233 and the side surface of the second insulating barrier layer 237. The resistive metal pattern 235 may have a third thickness t3 in the vertical direction that is less than the first thickness t1 of the first insulating barrier layer 227 and greater than the second thickness t2 of the etch-stop layer 233. In an example embodiment, the third thickness t3 of the resistive metal pattern 235 may be greater than about 0 Å and may be less than or equal to 45 Å.

The resistive metal pattern 235 may serve as a resistor in the semiconductor device 100. For example, the resistive metal pattern 235 may implement electrical resistance to a circuit in the semiconductor device 100. For example, the resistive metal pattern 235 may be used to reduce current flow, to adjust signal levels, to divide voltages, or to bias active elements. The resistive metal pattern 235 may have various planar shapes to serve as a resistor. The resistive metal pattern 235 may have a line/bar shape or a rectangular planar shape extending in at least one direction. The resistive metal pattern 235 may have a zigzag shape extending in the first direction (the X direction) and the second direction (the Y direction) to provide a relatively high resistance, but the shape thereof is not limited thereto.

The resistive metal pattern 235 may include or may be formed of a metal nitride, for example, titanium nitride, tantalum nitride, and/or tungsten nitride. The resistive metal pattern 235 may include or may be formed of a metal, for example, at least one of aluminum (Al), copper (Cu), and tungsten (W).

The second insulating barrier layer 237 may be disposed on the resistive metal pattern 235. The second insulating barrier layer 237 may be disposed between the resistive metal pattern 235 and the second insulating layer 240. The second insulating barrier layer 237 may include or may be formed of the same material as the first insulating barrier layer 227. In an example embodiment, the second insulating barrier layer 237 may be formed of one layer or a plurality of layers.

The second insulating layer 240 may cover/contact upper surfaces of the first and second insulating barrier layers 227 and 237. The second insulating layer 240 may cover/contact an upper surface and first and second side surfaces 230S1 and 230S2 of the resistive structure 230. The first side surface 230S1 may be a side surface of the resistive structure 230 in the first direction (the X direction), and the second side surface 230S2 is a side surface of the resistive structure 230 in the second direction (the Y direction). The first side surface 230S1 may extend from the upper surface of the first insulating barrier layer 227 in a third direction (a Z direction). The second insulating layer 240 may cover/contact side surfaces of the etch-stop layer 233, side surfaces of the resistive metal pattern 235, and side surfaces of the second insulating barrier layer 237. The second insulating layer 240 may cover/contact a lower surface and a side surface of the second wiring 260. The second insulating layer 240 may cover/contact a portion of side surfaces of the first and second conductive vias 250 and 255. The second insulating layer 240 may include or may be formed of the same material as the first insulating layer 210. The second insulating layer 240 may be an insulating layer in which the BEOL wiring structure is disposed in the semiconductor device 100.

The second insulating layer 240 may be formed below the second wiring 260 to have a thickness in a vertical direction (Z direction) on the first insulating barrier layer 227 the same as a thickness in the vertical direction on the resistive structure 230. The second insulating layer 240 may be penetrated by the first conductive via 250 in the third direction (the Z direction).

A portion of the second insulating layer 240 overlapping the second wiring 260 in the third direction (the Z direction) may have a region of which the thickness in the vertical direction changes in a horizontal direction approaching the first conductive via 250, as illustrated in FIG. 1B. For example, the second insulating layer 240 may have a region of which the thickness increases in the horizontal direction approaching to the first conductive via 250, e.g., on the first insulating barrier layer 227.

The upper surface of the second insulating layer 240 may have a first height H1 from an upper surface of the first wiring 220 in a region adjacent to the first conductive via 250, and may have a second height H2 from the upper surface of the first wiring 220 in a region adjacent to the second conductive via 255, and the first height H1 may be greater than the second height H2.

The second insulating layer 240 may have one surface in contact with the lower surface of the second wiring 260, and the one surface may have a curved region above the first side surface 230S1 of the resistive structure 230. The curved region may be formed in the process of conformally covering the step that is formed by the upper surface of the first insulating barrier layer 227 and the first and second side surfaces 230S1 and 230S2 of the resistive structure 230 by the second insulating layer 240. For example, the curved shape of the step coverage formed on a top surface the second insulating layer 240 may be transferred to a trench formed in the second insulating layer 240.

The first conductive via 250 may be disposed between the resistive metal pattern 235 and the second wiring 260. The first conductive via 250 penetrates through the second insulating barrier layer 237 and the second insulating layer 240 in the third direction (the Z direction) to electrically connect the resistive metal pattern 235 and the second wiring 260. The first conductive via 250 may contact the resistive metal pattern 235. According to certain example embodiments, the first conductive via 250 may be disposed on a partial recess formed on a top surface of the resistive metal pattern 235.

The second conductive via 255 may be disposed between the first wiring 220 and the second wiring 260. The second conductive via 255 penetrates through the first insulating barrier layer 227 and the second insulating layer 240 in a third direction (the Z direction) to electrically connect the first wiring 220 and the second wiring 260. The second conductive via 255 may contact the first wiring 220.

Shapes of a horizontal cross section of the first and second conductive vias 250 and 255 may be circular or elliptical, but are not limited thereto. Similarly, bottom surfaces of the first and second conductive vias 250 and 255 may be circular or elliptical. The lower/bottom surface of the first conductive via 250 may be positioned at a higher level than the lower/bottom surface of the second conductive via 255.

The second wiring 260 may be disposed in the second insulating layer 240. The second wiring 260 may extend lengthwise in the first direction (the X direction). A plurality of second wirings 260 may be disposed in the second insulating layer 240. For example, the second wirings 260 may be spaced apart from each other in the second direction (the Y direction). Although the first and second wirings 260 are illustrated to extend in the same direction in the present embodiment, the first and second wirings 260 may extend in different directions in certain embodiments. In an example embodiment, the upper surface of the second wiring 260 may be substantially coplanar with the upper surface of the second insulating layer 240. For example, the second wiring 260 may be formed in a trench formed in the second insulating layer 240, e.g., between sidewalls of the trench in the second direction Y.

As illustrated in FIG. 1B, the second wiring 260 may have a region in which a thickness in the vertical direction changes in the horizontal direction approaching to the first conductive via 250. For example, the second wiring 260 may have a region in which the thickness in the vertical direction decreases in the horizontal direction approaching to the first conductive via 250.

The second wiring 260 may have a first wiring thickness Ta in a region adjacent to the first conductive via 250 and a second wiring thickness Tb in a region adjacent to the second conductive via 255. The first wiring thickness Ta may be less than the second wiring thickness Tb.

The second wiring 260 may have a concave lower surface above the first side surface 230S1 of the resistive structure 230. The concave lower surface of the second wiring 260 may be formed above a step formed by the upper surface of the first insulating barrier layer 227 and the resistive structure 230.

In this embodiment, the second wiring 260 and the first and second conductive vias 250 and 255 may constitute a dual damascene structure integrally formed. The second wiring 260 and the first and second conductive vias 250 and 255 may have a dual damascene structure in which the second conductive barrier 265 and the second conductive line 266 are integrally formed, respectively. For example, the second conductive barrier 265 may be continuously and integrally formed between side walls of the trench and within side walls of a via hole formed in the second insulating layer 240, and the second conductive line 266 may be continuously and integrally formed within the trench and into the via hole. In certain embodiments, the second wiring 260 and the first and second conductive vias 250 and 255 may be together formed continuously and integrally to be electrically connected to one another. The second conductive barrier 265 may cover/contact the lower surface and side surfaces of the second conductive line 266. The second conductive barrier 265 and the second conductive line 266 may include or may be formed of the same materials as the first conductive barrier 225 and the first conductive line 226, respectively.

The third insulating barrier layer 267 may be disposed to cover an upper surface of the second insulating layer 240 and an upper surface of the second wiring 260. The third insulating barrier layer 267 may include or may be formed of the same material as the first insulating barrier layer 227. In an example embodiment, the third insulating barrier layer 267 may be formed of one layer or a plurality of layers. The third insulating barrier layer 267 may have substantially the same thickness as the first thickness t1 of the first insulating barrier layer 227.

The third insulating layer 270 may cover the upper surface of the third insulating barrier layer 267. The third insulating layer 270 may include or may be formed of the same material as the first insulating layer 210. The third insulating layer 270 may be an insulating layer in which a BEOL wiring structure is disposed in the semiconductor device 100.

Figure 1C:
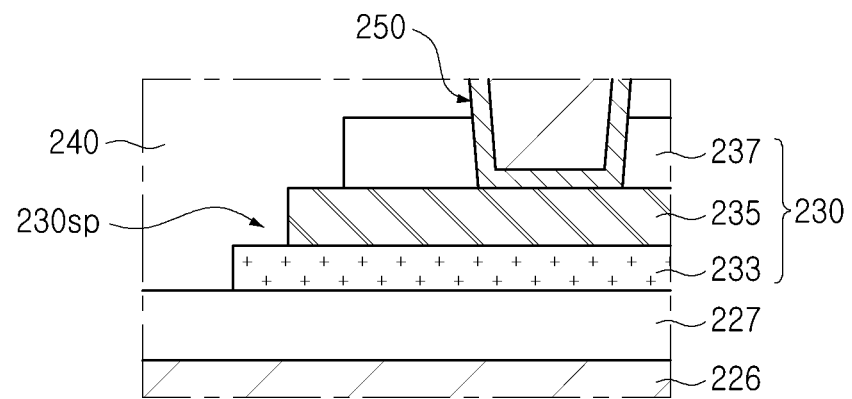
FIGS. 1C and 1D are partially enlarged cross-sectional views illustrating semiconductor devices according to example embodiments.

FIG. 1C is a partially enlarged cross-sectional view illustrating a semiconductor device according to example embodiments. FIG. 1C illustrates an area corresponding to a portion indicated by "A" in FIG. 1B.

Referring to FIG. 1C, the resistive structure 230 may include a stepped portion 230sp. The resistive structure 230 may have a stepped structure. The etch-stop layer 233 may extend longer than the resistive metal pattern 235 in at least one direction to form a step with the resistive metal pattern 235. The resistive metal pattern 235 may extend longer than the second insulating barrier layer 227 in at least one direction to form a step from the second insulating barrier layer 227. Portions of the upper surfaces of the etch-stop layer 233 and the resistive metal pattern 235 may contact the second insulating layer 240 by the steps.

Figure 1D:
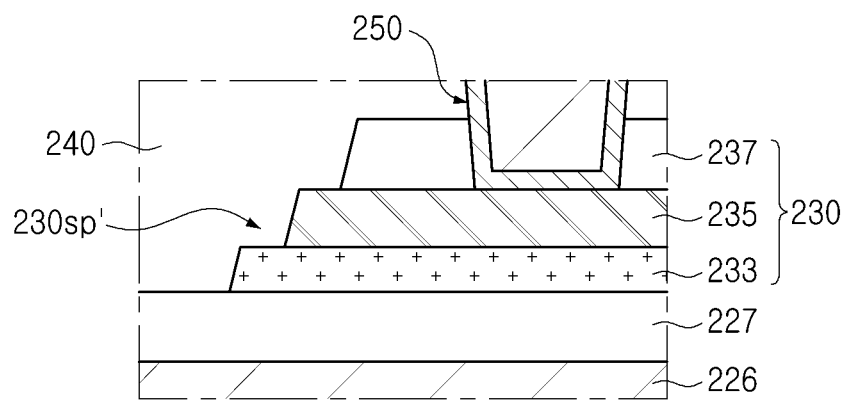

FIG. 1D is a partially enlarged cross-sectional view illustrating a semiconductor device according to example embodiments. FIG. 1D illustrates an area corresponding to a portion indicated by "A" in FIG. 1B.

Referring to FIG. 1D, the resistive structure 230 may include a stepped portion 230sp'. The resistive structure 230 has a staircase/step structure including the stepped portion 230sp', and the etch-stop layer 233, the resistive metal pattern 235 and the second insulating barrier layer 237 may respectively have a side inclined with respect to the upper surface of the substrate 101.

Figure 2A:
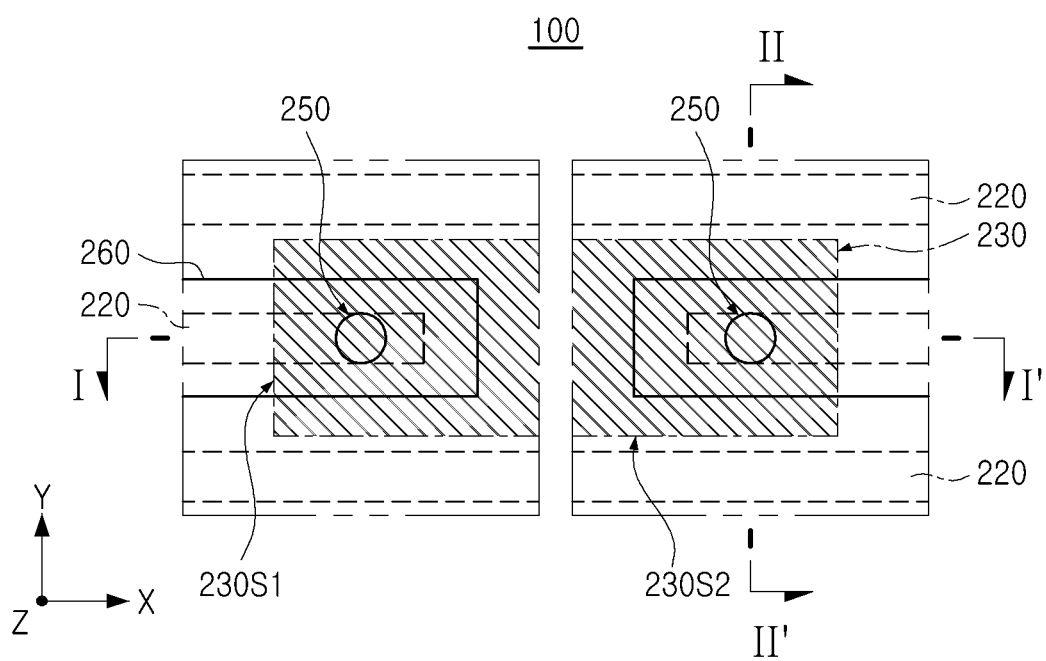
FIG. 2A is a plan view illustrating a semiconductor device according to example embodiments.

FIG. 2A is a plan view illustrating a semiconductor device according to example embodiments.

Figure 2B:
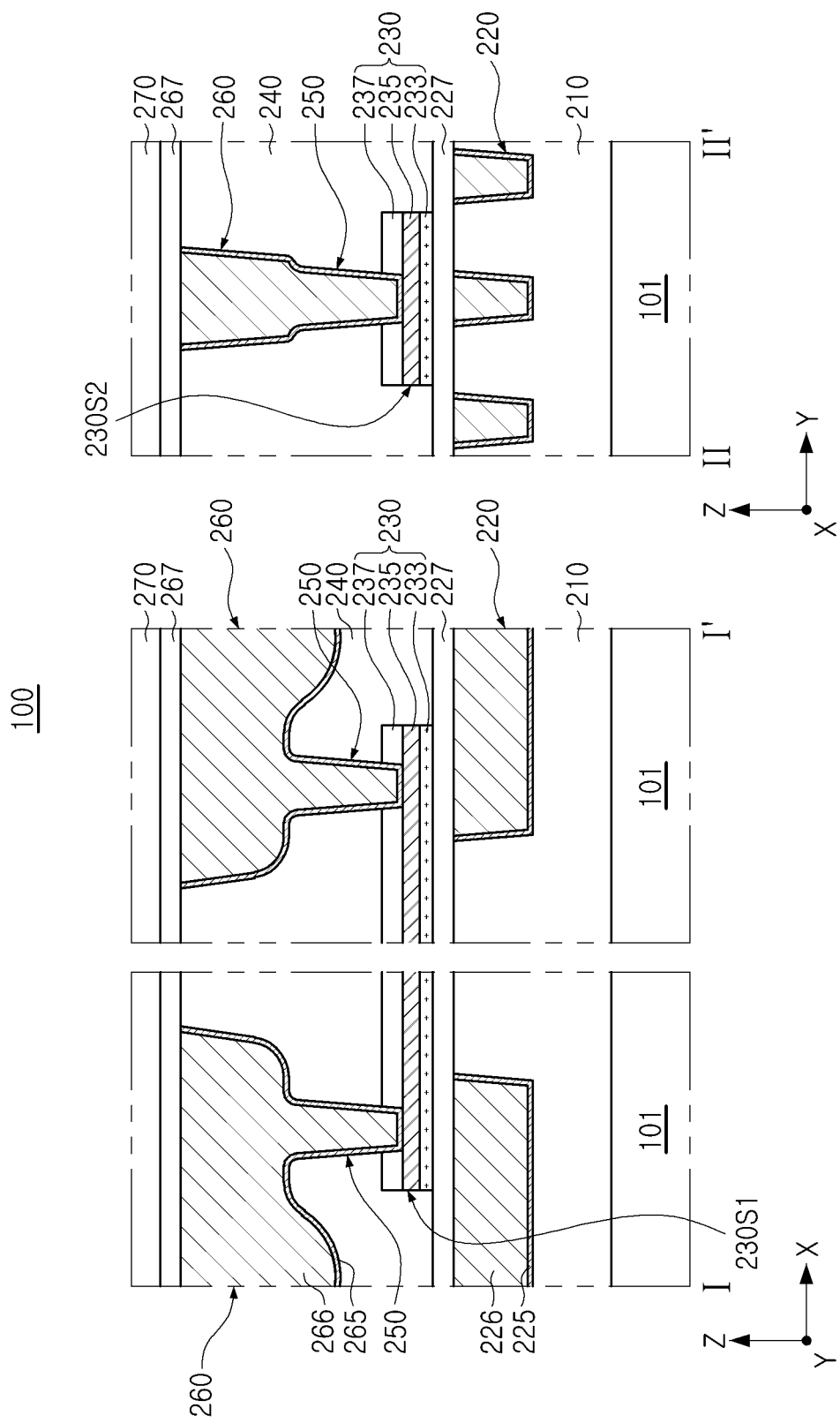
FIG. 2B is a cross-sectional view illustrating a semiconductor device according to example embodiments.

FIG. 2B is a cross-sectional view illustrating a semiconductor device according to example embodiments. FIG. 2B is a cross-sectional view of the semiconductor device of FIG. 2A taken along lines I-I' and FIGS. 2A and 2B illustrate regions different from those of FIGS. 1A and 1B in the semiconductor device 100.

Referring to FIGS. 2A and 2B, the second wirings 260 of the semiconductor device 100 may extend in the first direction (the X direction), and may be spaced apart from each other in the first direction (X direction). The first conductive vias 250 may be respectively, electrically connected to resistive metal patterns 235 of resistive structures 230 in a first region and a second region.

The resistive structure 230 may be disposed to extend in the first direction (the X direction) along the cutting line I-I'. The resistive metal pattern 235 is in the form of a line/bar extending in the first direction X between the first region and the second region, or has a shape having a pattern to provide a relatively long electrical connection path between the first region and the second region.

Each of the second wirings 260 may have a region in which the thickness is changed adjacent to the first conductive vias 250, in a direction approaching the first conductive vias 250. Each of the second wirings 260 may have a lower surface forming a curved surface above the first side surfaces 230S1 of the resistive structure 230, opposing each other. For example, the resistive structure 230 shown in FIG. 2A may be both end portions of a resistive structure 230.

Figure 3A:
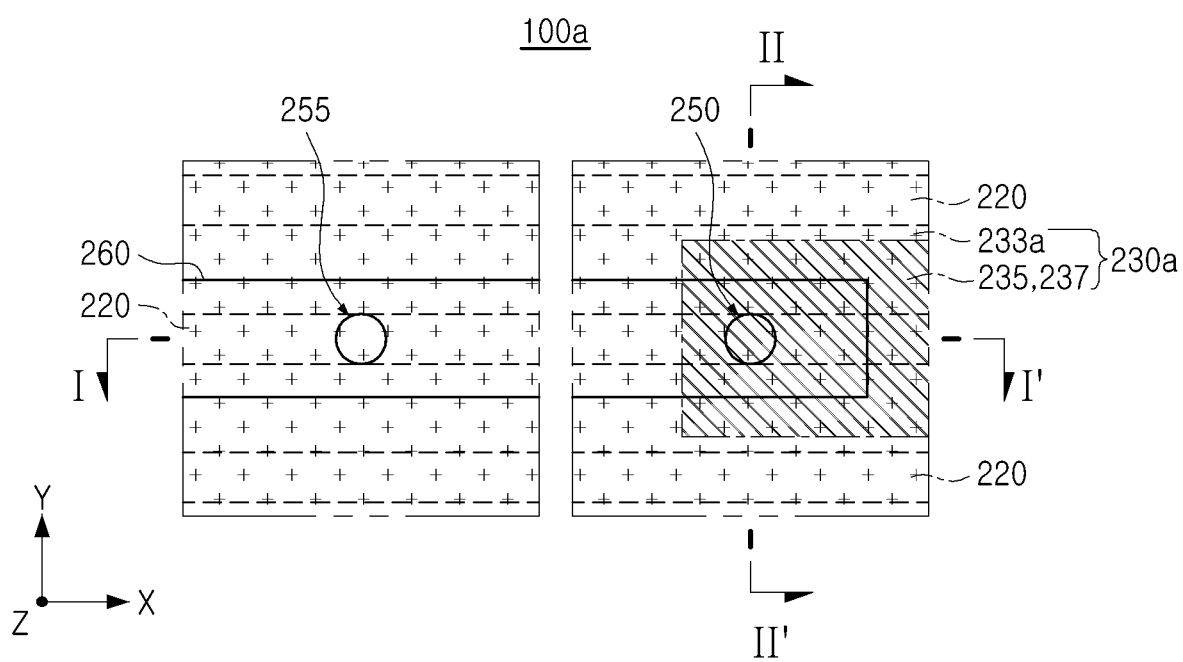
FIG. 3A is a plan view illustrating a semiconductor device according to example embodiments.

FIG. 3A is a plan view illustrating a semiconductor device according to example embodiments.

Figure 3B:
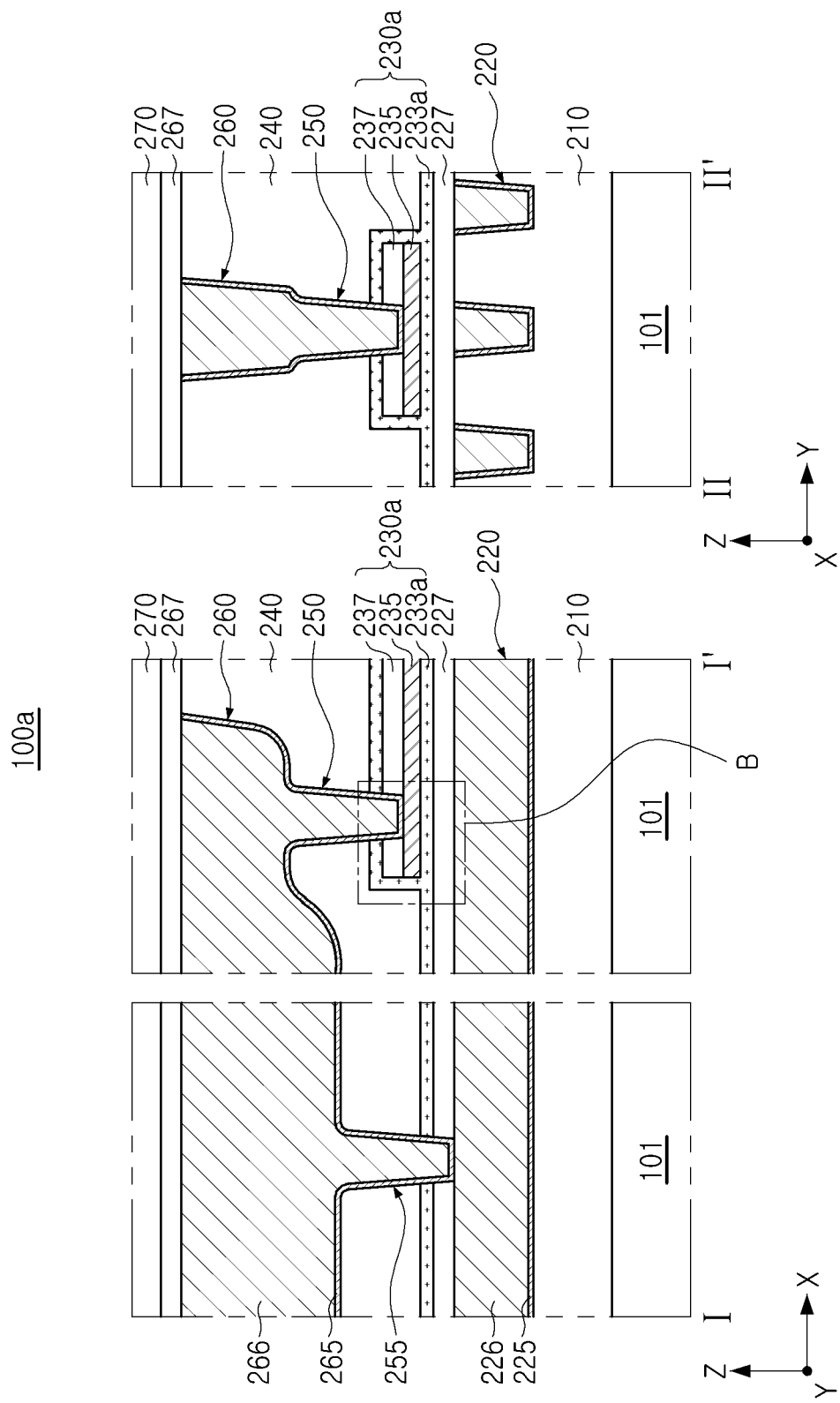
FIG. 3B is a cross-sectional view illustrating a semiconductor device according to example embodiments.

FIG. 3B is a cross-sectional view illustrating a semiconductor device according to example embodiments. FIG. 3B is a cross-sectional view of a semiconductor device of FIG. 3A taken along lines I-I' and Referring to FIGS. 3A and 3B, in a semiconductor device 100a, the structure of a resistive structure 230a may be different from that described above with reference to FIGS. 1A to 2B. An etch-stop layer 233a of the resistive structure 230a may be disposed to cover the entire upper surface of a first insulating barrier layer 227. The etch-stop layer 233a may be disposed to cover side surfaces of a resistive metal pattern 235 and an upper surface and side surfaces of a second insulating barrier layer 237. The etch-stop layer 233a may cover/contact portions of side surfaces of first and second conductive vias 250 and 255.

The first conductive via 250 penetrates through a second insulating barrier layer 237, the etch-stop layer 233a, and a second insulating layer 240 in a third direction (a Z direction) to electrically connect the resistive metal pattern 235 and the second wiring 260.

The second conductive via 255 penetrates through the first insulating barrier layer 227, the etch-stop layer 233a, and the second insulating layer 240 in a third direction (a Z direction) to electrically connect the first wiring 220 and the second wiring 260.

Figure 3C:
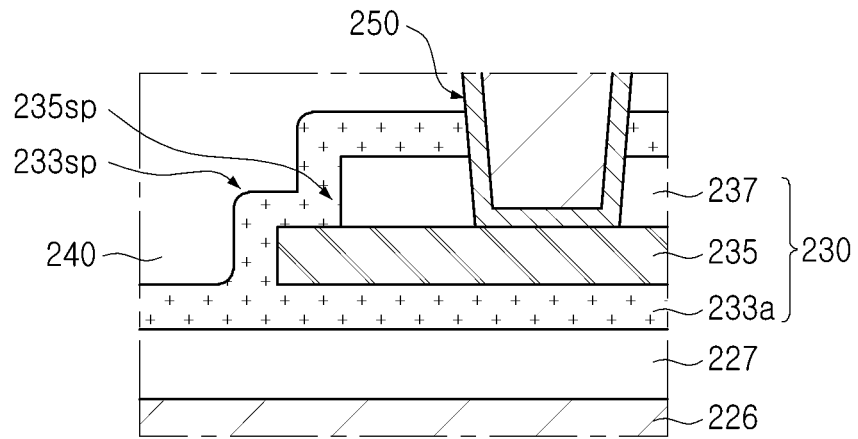
FIGS. 3C and 3D are partially enlarged cross-sectional views illustrating semiconductor devices according to example embodiments.

FIG. 3C is a partially enlarged cross-sectional view illustrating a semiconductor device according to example embodiments. FIG. 3C illustrates an area corresponding to a portion indicated by "B" in FIG. 3B.

Referring to FIG. 3C, the resistive metal pattern 235 and the second insulating barrier layer 237 of the resistive structure 230a may have a first stepped portion 235sp. The resistive metal pattern 235 and the second insulating barrier layer 237 may form a stepped structure. For example, the resistive metal pattern 235 may protrude from an end of the second insulating barrier layer 273 at the first stepped portion 235sp in a plan view. The etch-stop layer 233a may be disposed to cover the first stepped portion 235sp. The etch-stop layer 233a may have a second stepped portion 233sp having a stepped structure on the first stepped portion 235sp. For example, the etch-stop layer 233a may be conformally formed on the first insulating barrier layer 227, the resistive metal pattern 235, and the second insulating barrier layer 237 including the first stepped portion 235sp.

Figure 3D:
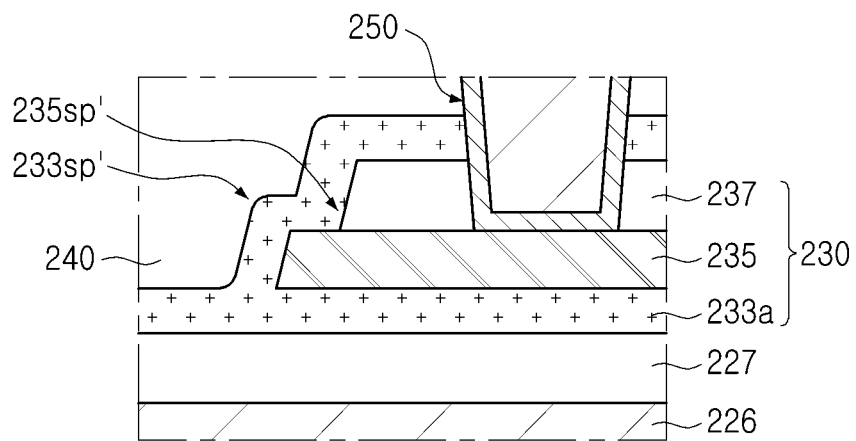

FIG. 3D is a partially enlarged cross-sectional view illustrating a semiconductor device according to example embodiments. FIG. 3D illustrates an area corresponding to a portion indicated by "B" in FIG. 3B.

Referring to FIG. 3D, the resistive metal pattern 235 and the second insulating barrier layer 237 of the resistive structure 230a form a step structure by a first stepped portion 235sp', and the resistive metal pattern 235 and the second insulating barrier layer 237 may have side surfaces each of which is inclined with respect to the upper surface of the substrate 101. The etch-stop layer 233a may have a side surface inclined with respect to the upper surface of the substrate 101 on the first stepped portion 235sp'. For example, the etch-stop layer 233a may be conformally formed on the first insulating barrier layer 227, on the resistive metal pattern 235, and on the second insulating barrier layer 237 including the first stepped portion 235sp'.

In the embodiments illustrated in FIGS. 3C and 3D, a first portion of the etch-stop layer 233a formed below the resistive metal pattern 235 and a second portion of the etch-stop layer 233a formed on the second insulating barrier layer 237 and on the first insulating barrier layer 225 are formed continuously without a boundary between the portions. In certain embodiments, a boundary may be formed between the first portion and the second portion of the etch-stop layer 233a. For example, the first portion and the second portion of the etch-stop layer 233a may be formed by different steps of process.

Figure 4A:
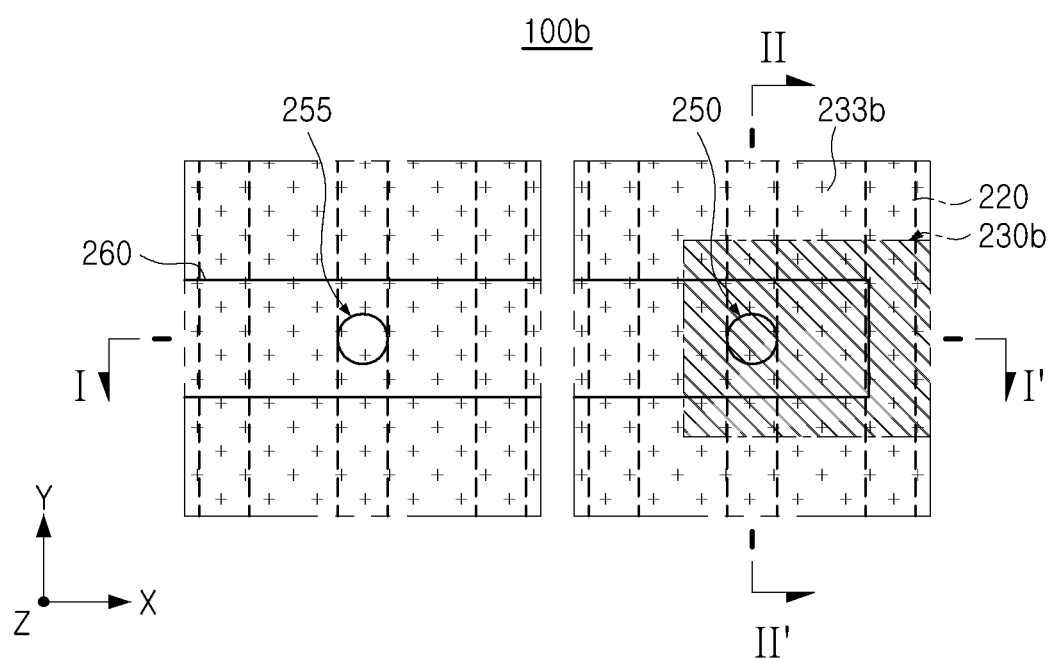
FIG. 4A is a plan view illustrating a semiconductor device according to example embodiments.

FIG. 4A is a plan view illustrating a semiconductor device according to example embodiments.

Figure 4B:
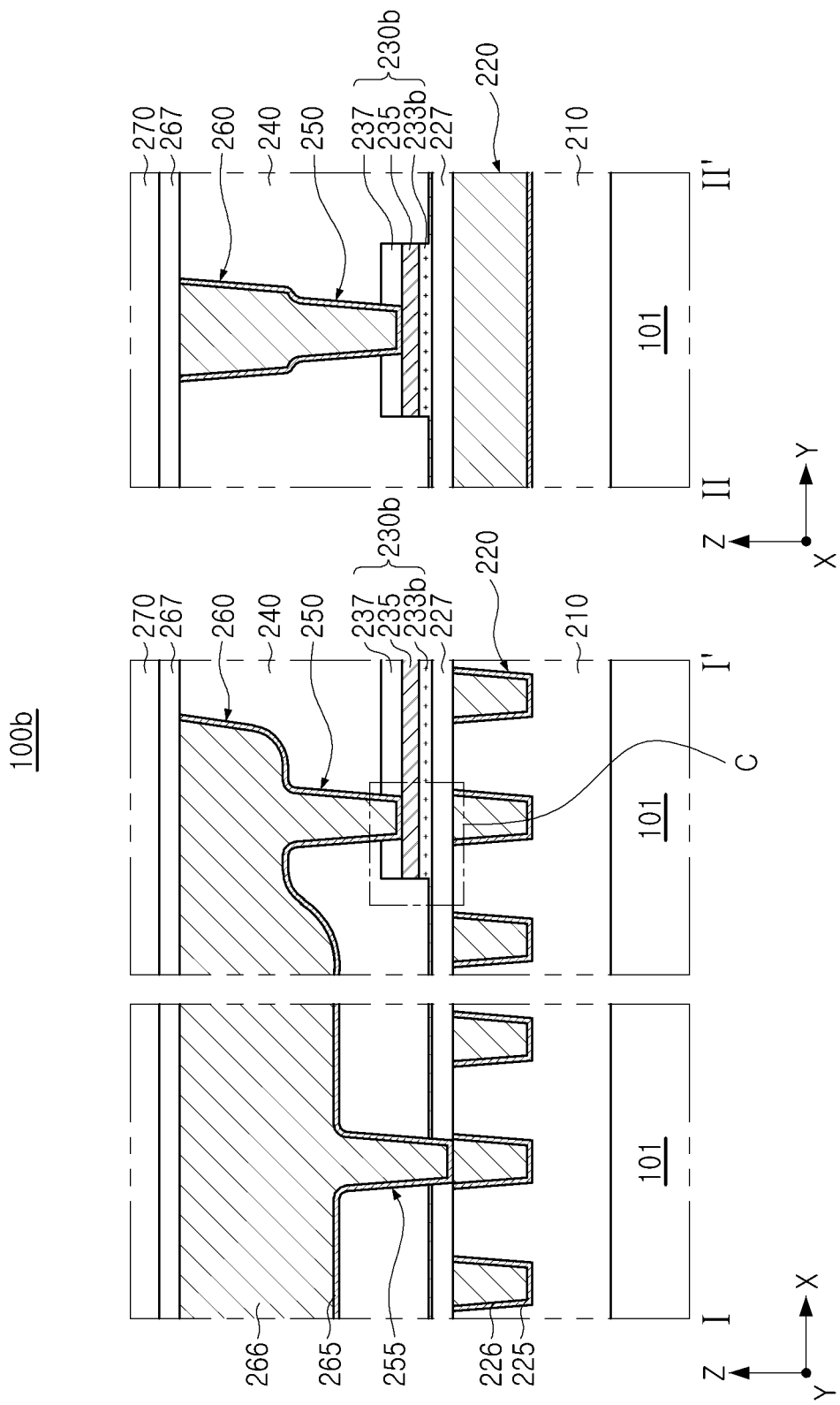
FIG. 4B is a cross-sectional view illustrating a semiconductor device according to example embodiments.

FIG. 4B is a cross-sectional view illustrating a semiconductor device according to example embodiments. FIG. 4B is a cross-sectional view of the semiconductor device of FIG. 4A taken along lines I-I' and II-II'.

Figure 4C:
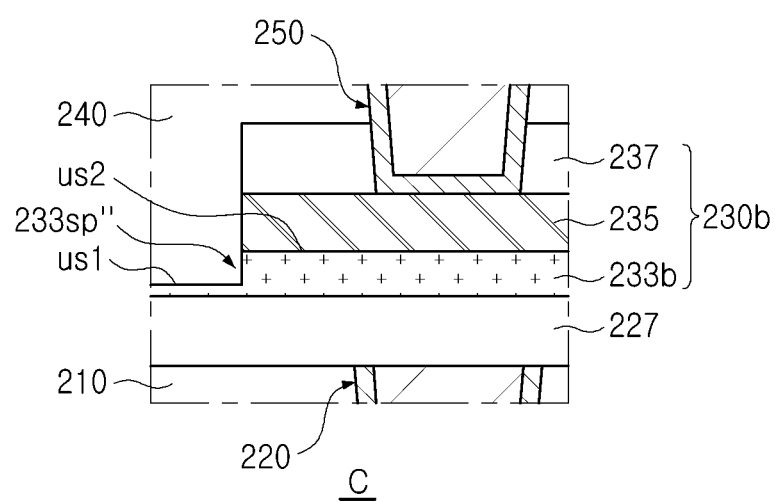
FIG. 4C is a partially enlarged cross-sectional view illustrating a semiconductor device according to example embodiments.

FIG. 4C is a partially enlarged cross-sectional view illustrating a semiconductor device according to example embodiments. FIG. 4C is an enlarged view of a portion indicated by "C" in FIG. 4B.

Referring to FIGS. 4A to 4C, in a semiconductor device 100b, extension directions of a first wiring 220 and a second wiring 260 may be different from each other, and the structure of a resistive structure 230b may be different from that described above with reference to FIGS. 1A to 2B.

The first wiring 220 may extend in a second direction (a Y direction), and the second wiring 260 may extend in a first direction (an X direction) perpendicular to the second direction Y. A second conductive via 255 may be electrically connected to at least one of a plurality of first wirings 220 disposed to be spaced apart from each other in the first direction (the X direction).

An etch-stop layer 233b of the resistive structure 230b may include a stepped portion 233sp" as illustrated in FIG. 4C. The side surface exposed by the stepped portion 233sp" of the etch-stop layer 233b may be inclined with respect to the upper surface of the substrate 101. The etch-stop layer 233b may have regions having different thicknesses. The etch-stop layer 233b may be disposed to cover the entire upper surface of the first insulating barrier layer 227. The etch-stop layer 233b is partially etched without being completely etched while the etch-stop layer 233b serves as a stopper during the etching process of forming the resistive structure 230b to remain below the second insulating layer 240.

The etch-stop layer 233b may have a first upper surface us1 in contact with the second insulating layer 240 and a second upper surface us2 in contact with the resistive metal pattern 235. In the etch-stop layer 233b, the second upper surface us2 may be positioned higher than the first upper surface us1 by the stepped portion 233sp. For example, the etch-stop layer 233b may have a greater thickness under the second upper surface us2 than under the first upper surface us1.

In another embodiment, during the etching process of forming the resistive structure, an upper portion of the first insulating barrier layer 227 may be partially etched to have a step. In this case, the first insulating barrier layer 227 may have regions having different thicknesses. For example, the first insulating barrier layer 227 may have a greater thickness at a portion in contact with the etch-stop layer 233b than a portion in contact with the second insulating layer 240.

The description of this embodiment may be equally applied to other embodiments of the present specification. For example, in the semiconductor device 100 described above with reference to FIGS. 1A and 1B, only an upper portion of the etch-stop layer 233 may be etched to remain a lower portion of the etch-stop layer 233 below the second insulating layer 240.

Figure 5:
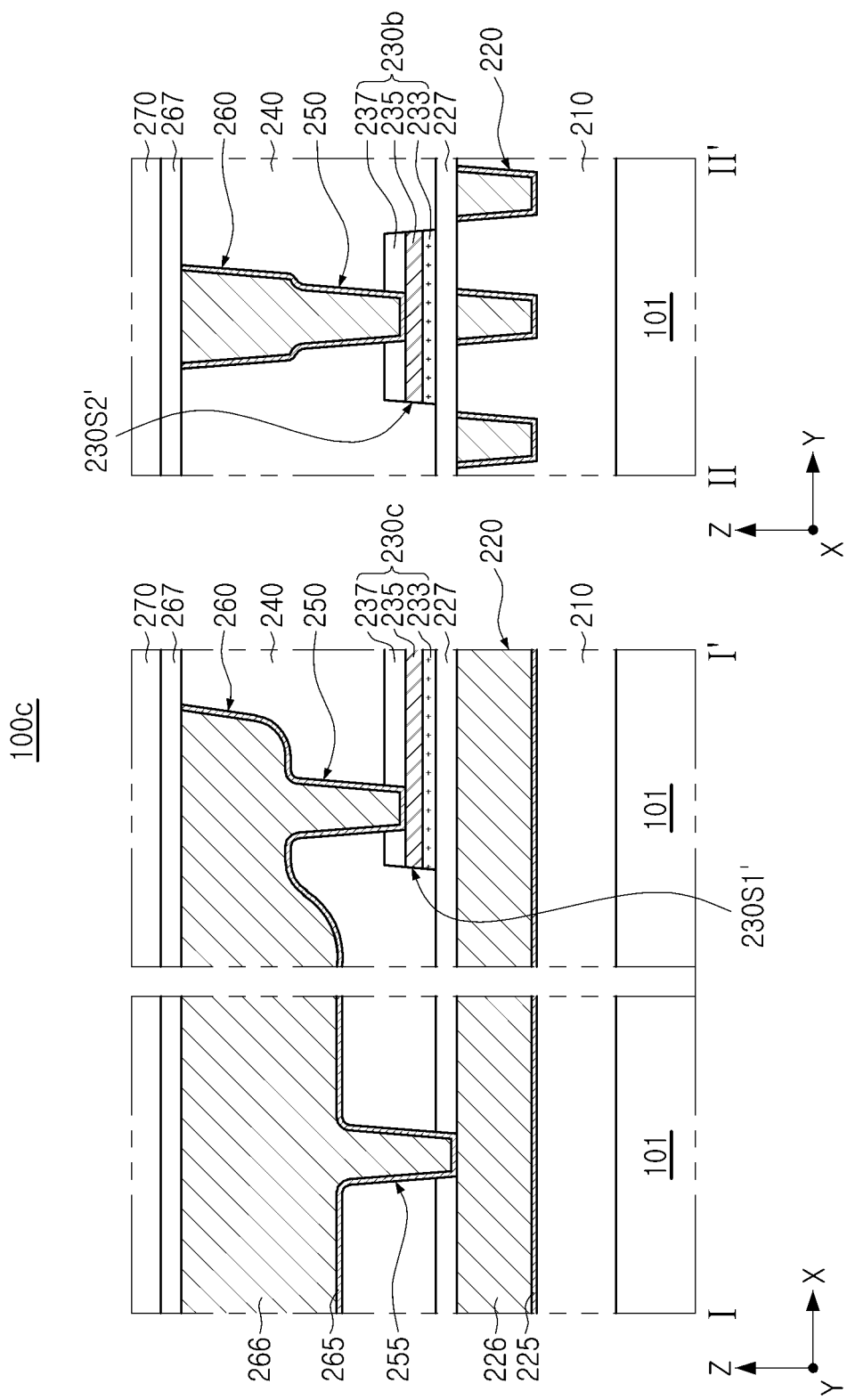
FIG. 5 is a cross-sectional view illustrating a semiconductor device according to example embodiments.

FIG. 5 is a cross-sectional view illustrating a semiconductor device according to example embodiments. FIG. 5 illustrates regions corresponding to cross-sections of the semiconductor device of FIG. 1A taken along lines I-I' and Referring to FIG. 5, in a semiconductor device 100c, the structure of a resistive structure 230c may be different from that described above with reference to FIGS. 1A to 2B. The resistive structure 230c may have first side surfaces 230S1' and second side surfaces 230S2' inclined with respect to the upper surface of the substrate 101. For example, as shown in FIG. 5, the first side surfaces 230S1' may be side surfaces extending in the second direction Y among side surfaces of the resistive structure 230c, and the second side surfaces 230S2' may be side surfaces extending in the first direction X among side surfaces of the resistive structure 230c. The resistive structure 230c may have a tapered structure in which the width of the resistive structure 230c increases toward the upper surface of the substrate 101 by the inclined first and second side surfaces 230S1' and 230S2'. For example, the width of the upper end of the resistive structure 230c may be less than the width of the lower end of the resistive structure 230c in the second direction (the Y direction).

The first and second conductive vias 250 and 255 may have a tapered structure that narrows toward the upper surface of the substrate 101. The resistive structure 230c and first and second conductive vias 250 and 255 may have different taper directions, e.g., opposite taper directions from each other.

Figure 6:
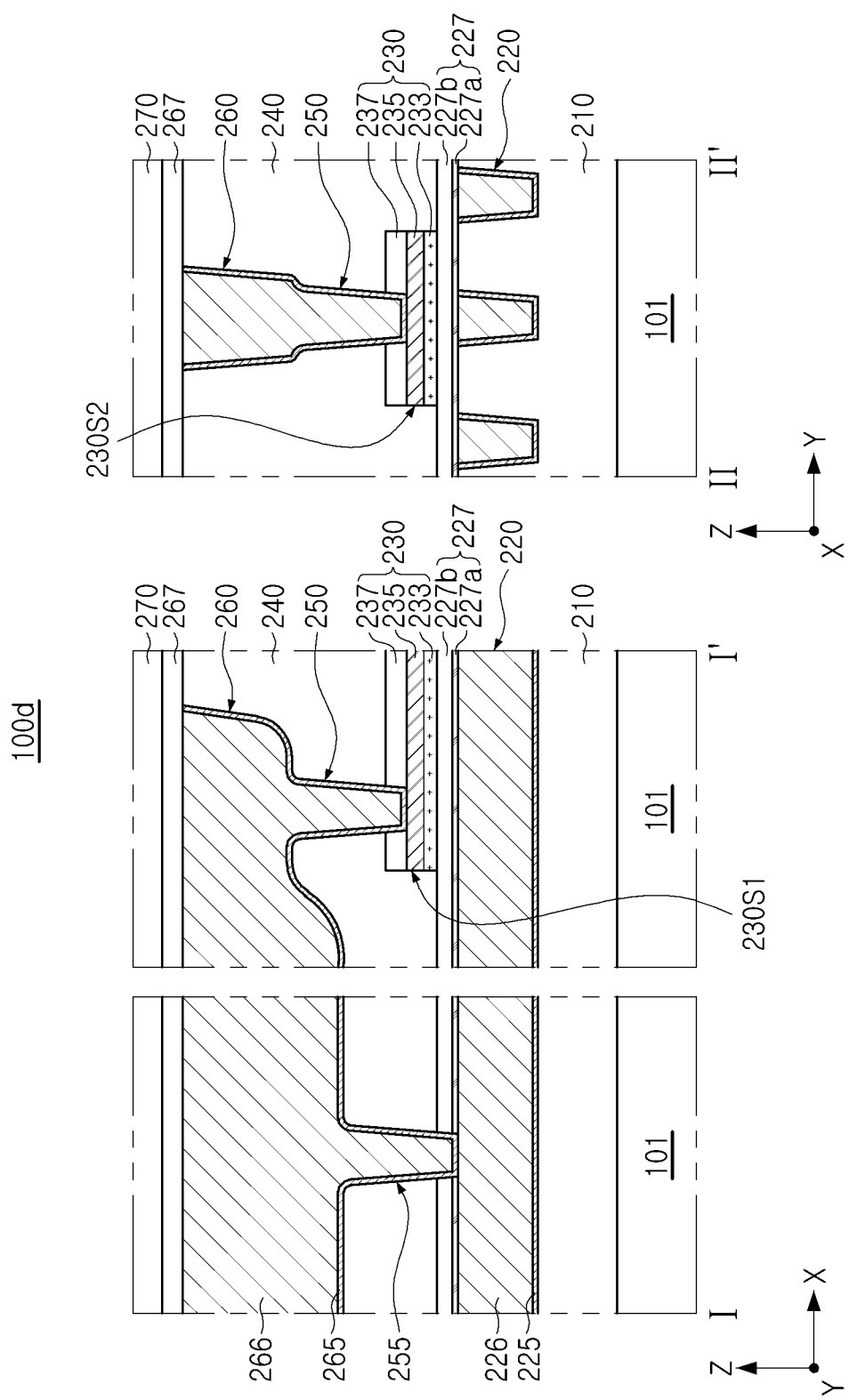
FIG. 6 is a cross-sectional view illustrating a semiconductor device according to example embodiments.

FIG. 6 is a cross-sectional view illustrating a semiconductor device according to example embodiments. FIG. 6 illustrates regions corresponding to cross-sections of the semiconductor device of FIG. 1A taken along lines I-I' and II-II'.

Referring to FIG. 6, in a semiconductor device 100d, a first insulating barrier layer 227 may be formed of a first layer 227a and a second layer 227b. The second layer 227b may be disposed on the first layer 227a. The first and second layers 227a and 227b may be stacked in a vertical direction. The first layer 227a may include or may be formed of an aluminum-containing material such as aluminum nitride (AlN), aluminum oxide (AlO), and aluminum oxycarbide (AlOC). The second layer 227b may include or may be formed of, for example, a silicon-containing material such as silicon nitride (SiN), silicon carbide (SiC), silicon oxycarbide (SiOC), silicon oxynitride (SiON), and silicon carbonitride (SiCN). In certain example embodiments, the first insulating barrier layer 227 may include or may be formed of two or more layers stacked in a vertical direction.

The first layer 227a may have a thickness greater than 0 Å and less than or equal to about 15 Å. The second layer 227b may have a thickness greater than 0 Å and less than or equal to about 50 Å. The thickness of the first layer 227a may be less than the thickness of the second layer 227b.

The description of the first insulating barrier layer 227 of this embodiment may also be applied to the second insulating barrier layer 237 or the third insulating barrier layer 267 in another example embodiment. For example, the second insulating barrier layer 237 or the third insulating barrier layer 267 of this embodiment or another embodiment of the present disclosure may be formed of two layers the same as the first layer 227a and the second layer 227b describe above or may be formed of more than two layers.

Figure 7:
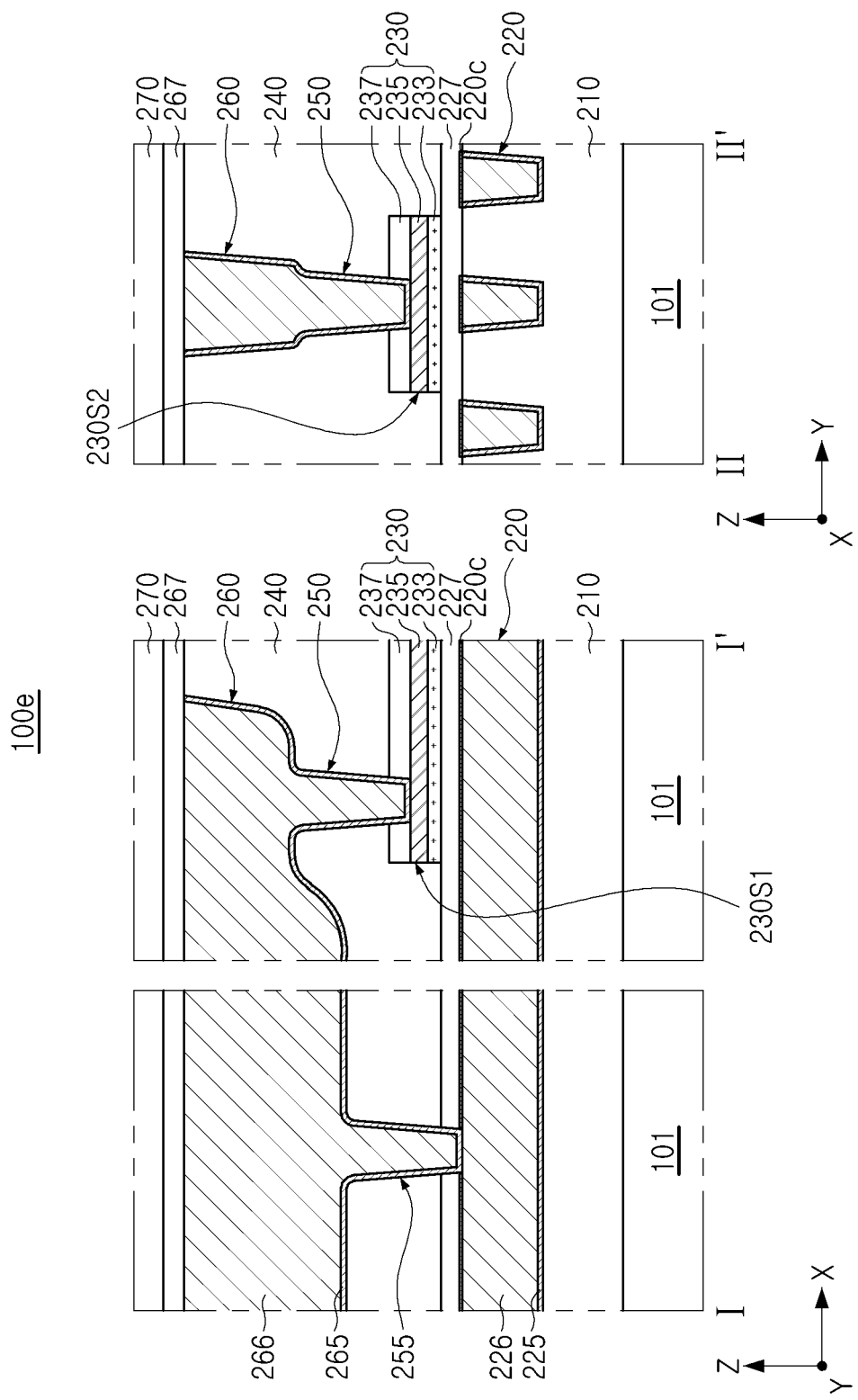
FIG. 7 is a cross-sectional view illustrating a semiconductor device according to example embodiments.

FIG. 7 is a cross-sectional view illustrating a semiconductor device according to example embodiments. FIG. 7 illustrates regions corresponding to cross-sections of the semiconductor device of FIG. 1A taken along lines I-I' and Referring to FIG. 7, a semiconductor device 100e may further include a capping layer 220c disposed between the first wiring 220 and the first insulating barrier layer 227. The capping layer 220c may cover an upper surface of the first wiring 220. The second conductive via 255 may penetrate through the capping layer 220c in the third direction (the Z direction) to be electrically connected to the first wiring 220. The capping layer 220c may serve to improve electromigration (EM) characteristics of the first wiring 220. The capping layer 220c may include or may be formed of a metal-containing material such as cobalt (Co) or manganese (Mn).

The description of this embodiment may be equally applied to other embodiments of the present specification. For example, any other embodiments described above and below may additionally include a capping layer the same as the capping layer 220c described above.

FIGS. 8A to 8E are diagrams illustrating a process sequence to illustrate a method of manufacturing a semiconductor device according to example embodiments. In FIGS. 8A to 8E, an example embodiment of a method of manufacturing the semiconductor device of FIGS. 1A and 1B will be described.

Referring to FIG. 8A, after forming the first insulating layer 210 on the substrate 101 on which the integrated circuit is disposed, the first wiring 220 may be formed. Next, the first insulating barrier layer 227 may be formed on the first insulating layer 210 and the first wiring 220.

Before the first insulating layer 210 is formed, transistors may be formed on the substrate 101. The transistors and a lower insulating layer covering the transistors may be formed between the substrate 101 and the first insulating layer 210. The transistors may be formed by a front end of line (FEOL) process. For example, the FEOL process may include from an initial cleaning of a wafer up to just before the first deposition of a metal interconnect layer in a process of manufacturing a semiconductor device. The metal interconnect layer may be a metal layer which is patterned to be metal interconnect patterns or interconnects. Interconnect patterns or interconnects may be structures that connect two or more circuit elements such as transistors, resistors, etc.

The first insulating layer 210 may be formed on the substrate 101. The first insulating layer 210 may be formed of silicon oxide or a low dielectric constant (low-k) insulating material having a lower dielectric constant than that of silicon oxide. The first insulating layer 210 may be an insulating layer in which a BEOL wiring structure is disposed in the semiconductor device 100.

The first wiring 220 may be formed in the first insulating layer 210. After a trench is formed by removing a portion of the first insulating layer 210, a first conductive barrier 225 and a first conductive line 226 may be sequentially formed in the trench to form the first wiring 220. After forming the first conductive barrier 225 and the first conductive line 226, a planarization process may be performed so that the upper surfaces of the first wiring 220 and the first insulating layer 210 are coplanar.

The first conductive barrier 225 may include at least one of titanium (Ti), tantalum (Ta), cobalt (Co), titanium nitride (TiN), tantalum nitride (TaN), and graphene. The first conductive line 226 may include a conductive material, for example, at least one of aluminum (Al), copper (Cu), cobalt (Co), ruthenium (Ru), and tungsten (W).

The first insulating barrier layer 227 may be conformally formed on the first insulating layer 210 and the first wiring 220. The first insulating barrier layer 227 may include or may be formed of a silicon-containing material such as silicon nitride (SiN), silicon carbide (SiC), silicon oxycarbide (SiOC), silicon oxynitride (SiON), and silicon carbonitride (SiCN). The first insulating barrier layer 227 may include or may be formed of a metal-containing material such as metal nitride or metal oxide. The first insulating barrier layer 227 may include or may be formed of an aluminum-containing material such as aluminum nitride (AlN), aluminum oxide (AlO), and aluminum oxycarbide (AlOC).

Referring to FIG. 8B, an etch-stop layer 233', a resistive metal layer 235', and a second insulating barrier layer 237' may be sequentially formed on the first insulating barrier layer 227. The etch-stop layer 233', the resistive metal layer 235', and the second insulating barrier layer 237' on the first insulating barrier layer 227 may form a preliminary resistive structure 230'. For example, the etch-stop layer 233' and the second insulating barrier layer 237' are layers generally formed on the substrate 101 overall, e.g., before forming the patterned resistive structure 230, and the other etch-stop layers and second insulating barrier layers in the present disclosure are layers patterned one way or another by patterning process respectively.

The etch-stop layer 233' may be conformally formed on the first insulating barrier layer 227. The etch-stop layer 233' may include or may be formed of aluminum oxide, aluminum nitride, aluminum oxynitride, or a combination thereof. In addition to aluminum (Al), the etch-stop layer 233' may further include at least one of titanium (Ti), tantalum (Ta), cobalt (Co), zirconium (Zr), ruthenium (Ru), lanthanum (La), and hafnium (Hf). The etch-stop layer 233' may further include nitrogen (N) and/or carbon (C). For example, the etch-stop layer 233' may include at least one of, for example, aluminum oxide (AlOx), aluminum oxynitride (AlON), aluminum oxycarbide (AlOC), aluminum zirconium oxide ($Al_xZr_yO_z$), and aluminum hafnium oxide ($Al_xHf_yO_x$).

The resistive metal layer 235' may be conformally formed on the etch-stop layer 233'. The resistive metal layer 235' may include or may be formed of a metal nitride, for example, titanium nitride, tantalum nitride, and/or tungsten nitride. The resistive metal layer 235' may include a metal, for example, at least one of aluminum (Al), copper (Cu), and tungsten (W).

The second insulating barrier layer 237' may be conformally formed on the resistive metal layer 235'. The second insulating barrier layer 237' may include or may be formed of the same material as the first insulating barrier layer 227.

Referring to FIG. 8C, the resistive structure 230 may be formed by performing a photolithography process and anisotropic etching process.

Through the etching process, portions of the etch-stop layer 233', the resistance metal layer 235', and the second insulating barrier layer 237' of FIG. 8B are removed, to form the etch stop layer 233, the resistive metal pattern 235, and the second insulating barrier layer 237. Side surfaces of the etch-stop layer 233, the resistive metal pattern 235, and the second insulating barrier layer 237 may be exposed by the etching process. In certain embodiments, the side surfaces may be formed to be inclined with respect to the upper surface of the substrate 101.

If the etch-stop layer 233' is omitted, the upper surface of the first insulating barrier layer 227 may be damaged by the etching process, and the first wiring 220 may be exposed to an etchant in etching process and may be damaged. According to an example embodiment of the present inventive concept, since the etch-stop layer 233' serves as a stopper, damage of the first insulating barrier layer 227 to the etchant may be significantly reduced or prevented, so that the first wiring 220 may be protected by the first insulating barrier layer 227. Accordingly, damage to the first wiring 220 may be prevented, and reliability of the semiconductor device may be improved.

Figure 8D:
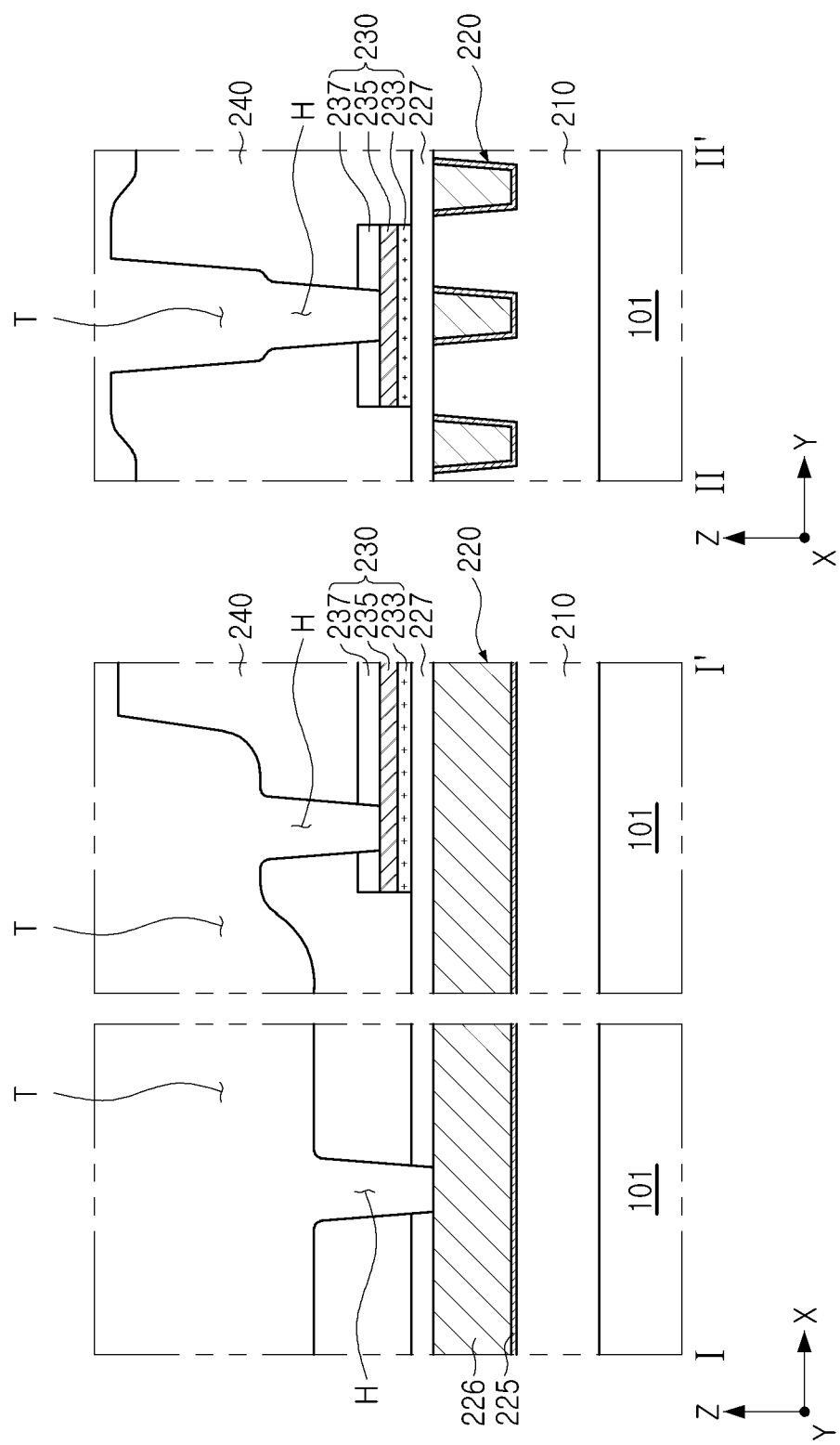

Referring to FIG. 8D, a second insulating layer 240 covering the first insulating barrier layer 227 and the second insulating barrier layer 237 may be formed. Next, a first trench T and first via holes H may be formed. The first trench T and the first via holes H may be formed by performing a dual damascene process.

Figure 8E:
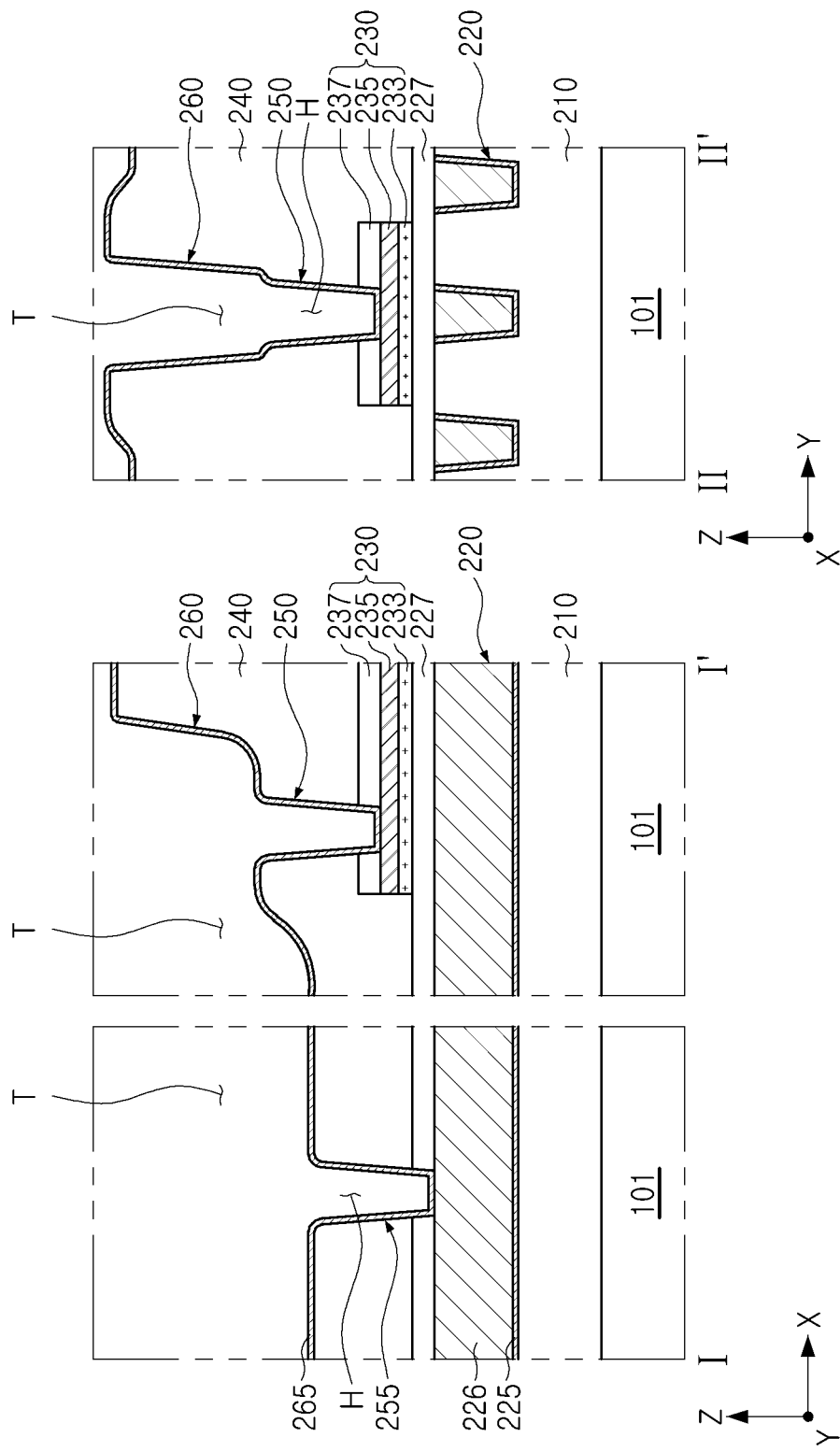

The second insulating layer 240 may be formed on the substrate 101 to have a uniform thickness. For example, the second insulating layer 240 may have substantially the same thickness on the first insulating barrier layer 227 and on the resistive structure 230. The second insulating layer 240 may include a region in which the height of the upper surface is relatively high by the resistive structure 230, on the substrate 101. For example, a top surface of the second insulating layer 240 above the resistive structure 230 may be higher than a top surface of the second insulating layer 240 above the first insulating barrier layer 227 as shown in FIGS. 8D and 8E. The second insulating layer 240 may include or may be formed of the same material as the first insulating layer 210.

The first trench T extending in the first direction (the X direction) and the first via holes H extending in the third direction (the Z direction) may be formed in the second insulating layer 240. Before forming the first trench T, a mask pattern including a portion corresponding to a trench in a region in which the second wiring 260 of FIG. 1B is to be formed may be formed on the second insulating layer 240. A first via hole H may penetrate through the second insulating barrier layer 237 to expose a portion of the upper surface of the resistive metal pattern 235. Another first via hole H may penetrate through the first insulating barrier layer 227 to expose a portion of the upper surface of the first wiring 220.

Referring to FIG. 8E, a second conductive barrier 265 may be formed to conformally cover sidewalls of the first trench T and the first via holes H. The second conductive barrier 265 may cover a portion of the exposed upper surface of the resistive metal pattern 235 and a portion of the exposed upper surface of the first wiring 220.

Next, referring to FIG. 1B, a second conductive line 266 filling the inside of the first trench T and the first via holes H may be formed. A planarization process may be performed so that the upper surface of the second insulating layer 240 is exposed. A third insulating barrier layer 267 and a third insulating layer 270 covering the second insulating layer 240 and the second wiring 260 may be sequentially formed.

The second conductive line 266 may be formed to have a relatively great thickness to cover the uppermost portion of the second insulating layer 240. For example, the second conductive line 266 may be thicker than the resistive metal pattern 235 and the first wiring 220. The second conductive line 266 may be formed to cover the second conductive barrier 265. The second conductive barrier 265 may include at least one of titanium (Ti), tantalum (Ta), cobalt (Co), titanium nitride (TiN), and tantalum nitride (TaN). The second conductive line 266 may include or may be formed of a conductive material, for example, at least one of aluminum (Al), copper (Cu), and tungsten (W). The first and second conductive vias 250 and 255 and the second wiring 260 may be formed by filling the first trench T and the first via holes H with the second conductive line 266. After forming the second conductive barrier 265 and the second conductive line 266, a planarization process may be performed so that the upper surfaces of the second wiring 260 and the second insulating layer 240 are coplanar.

The third insulating barrier layer 267 may cover upper surfaces of the planarized second insulating layer 240 and the second wiring 260. The third insulating barrier layer 267 may include or may be formed of the same material as the first insulating barrier layer 227.

Figure 9A:
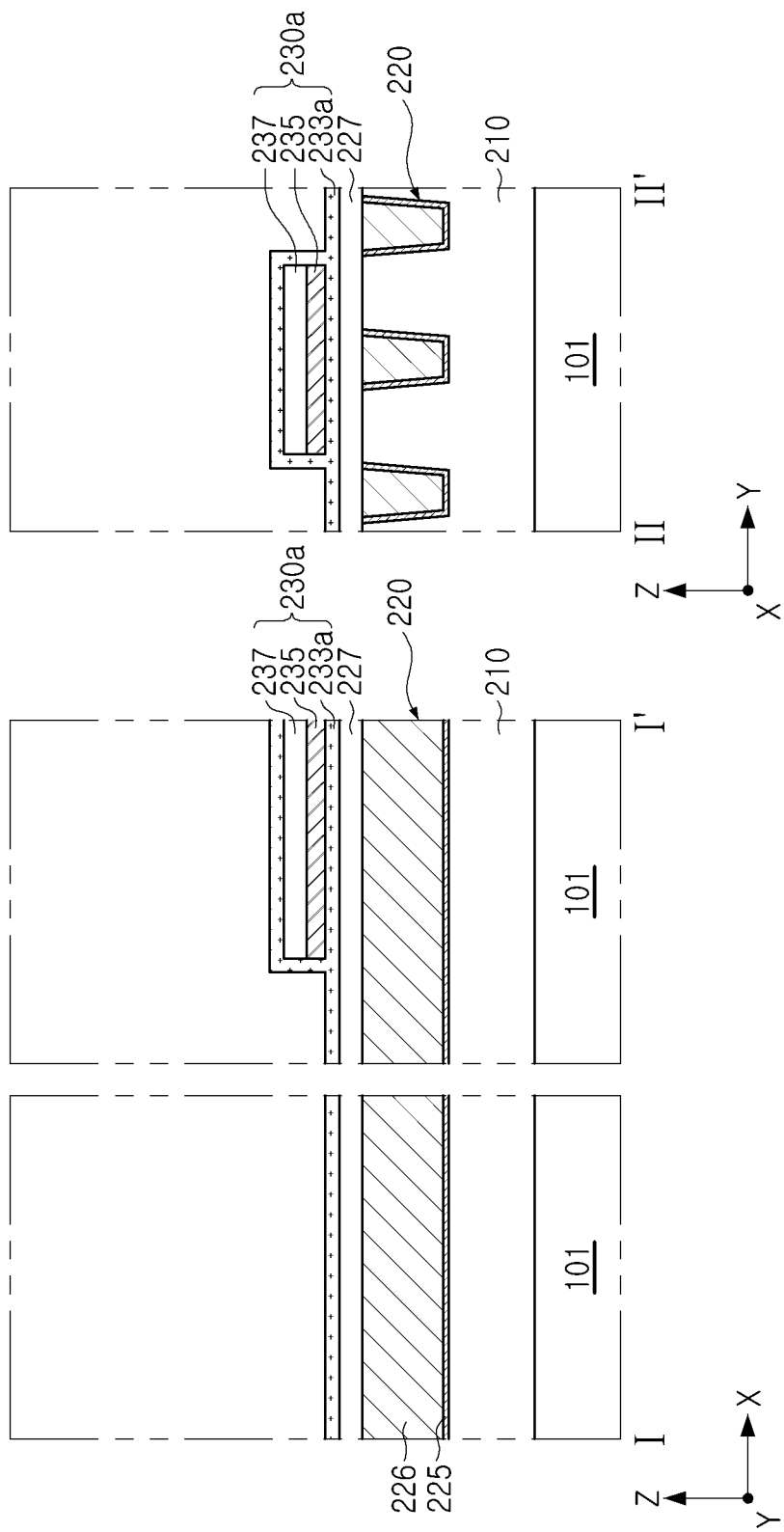
FIGS. 9A to 9C are diagrams illustrating a process sequence to illustrate a method of manufacturing a semiconductor device according to example embodiments.
Figure 9B:
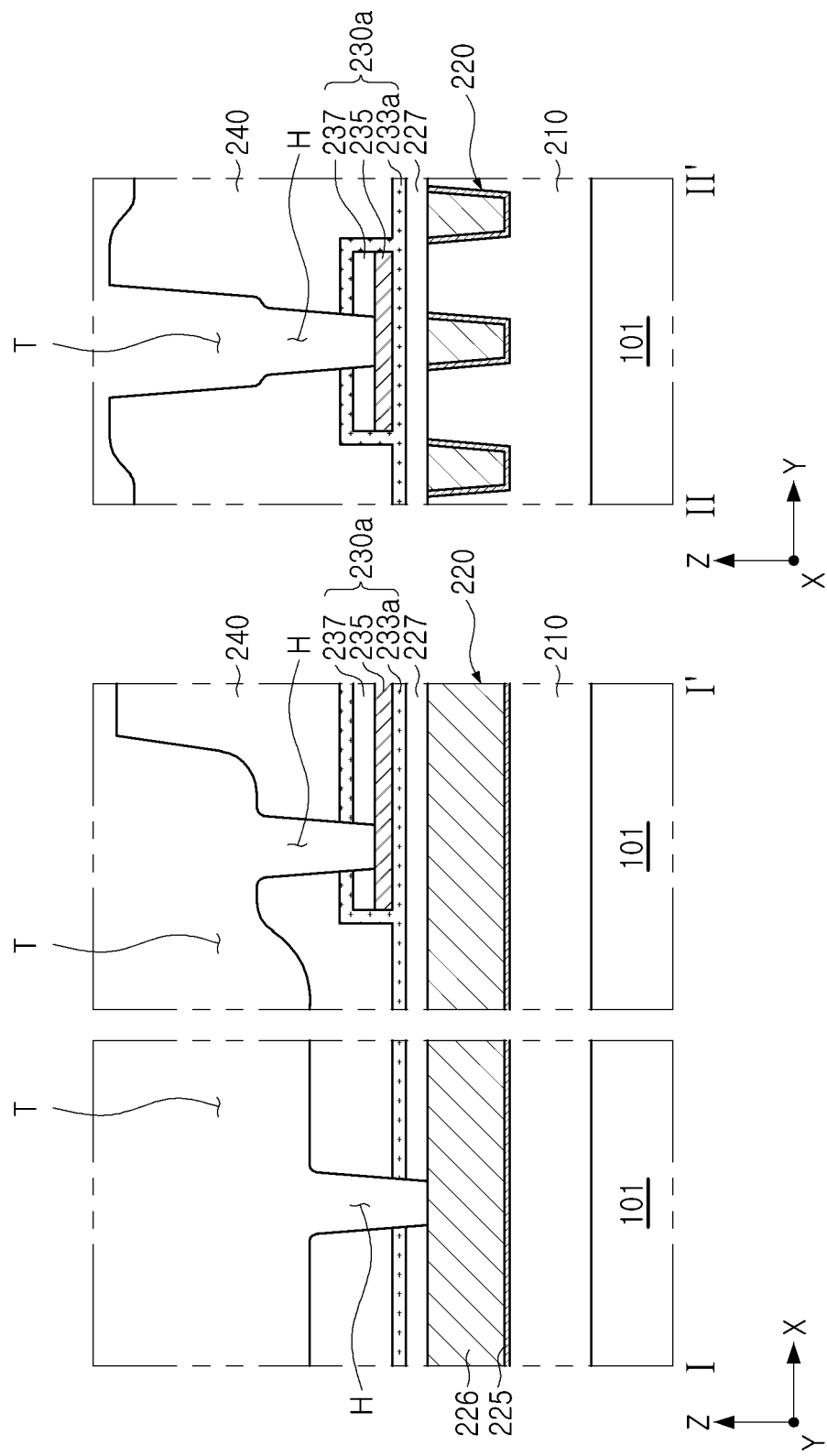
Figure 9C:
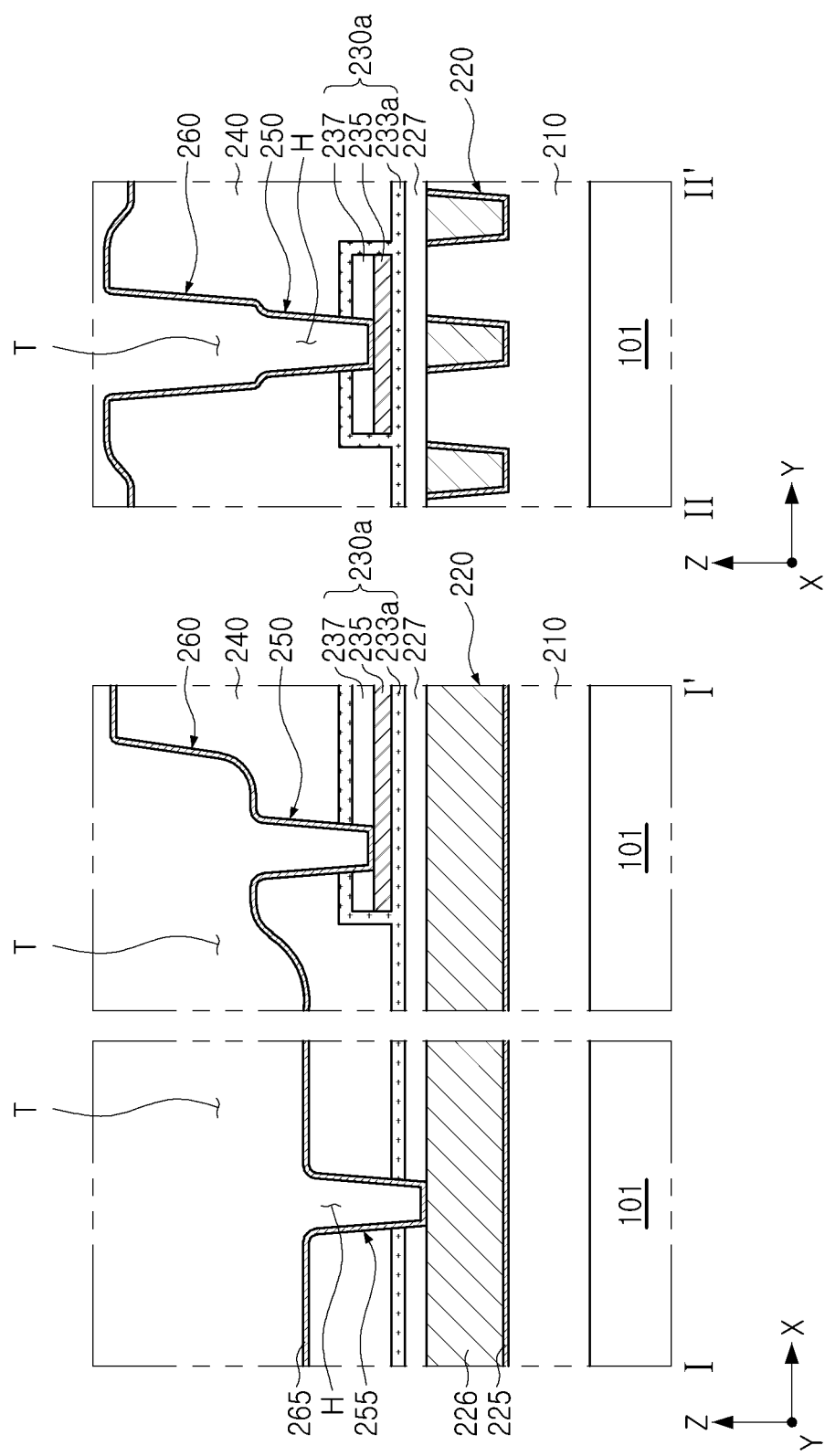

FIGS. 9A to 9C are diagrams illustrating a process sequence to illustrate a method of manufacturing a semiconductor device according to example embodiments. In FIGS. 9A to 9C, an example embodiment of a method of manufacturing the semiconductor device of FIGS. 3A and 3B will be described.

First, the first insulating layer 210, the first wiring 220, the first insulating barrier layer 227, and the resistive structure 230 may be formed on the substrate 101 by performing the above-described process with reference to FIGS. 8A to 8C.

Next, referring to FIG. 9A, the etch-stop layer 233a may be formed by additionally depositing the same material as the etch-stop layer 233 on the substrate 101.

The etch-stop layer 233a may be formed to cover the entire upper surface of the first insulating barrier layer 227. The etch-stop layer 233a may be formed to cover side surfaces of the resistive metal pattern 235 and an upper surface and side surfaces of the second insulating barrier layer 237.

Referring to FIG. 9B, a second insulating layer 240 covering the etch-stop layer 233a may be formed. Next, the first trench T and the first via holes H may be formed. The first trench T and the first via holes H may be formed by performing a dual damascene process.

A first via hole H may penetrate through a portion of the etch-stop layer 233a covering the upper surface of the second insulating barrier layer 237. The first via hole H may also penetrate the second insulating barrier layer 273 to expose a top surface of the resistive metal pattern 235. Another first via hole H may penetrate through a portion of the etch-stop layer 233a covering the upper surface of the first insulating barrier layer 227 in a region in which the resistive structure 230a is not disposed. This first via hole H may also penetrate the first insulating barrier layer 227 to expose the first wiring 220.

Referring to FIG. 9C, a second conductive barrier 265 may be formed to conformally cover sidewalls of the first trench T and the first via holes H. The second conductive barrier 265 may cover a portion of the exposed upper surface of the resistive metal pattern 235 and a portion of the exposed upper surface of the first wiring 220.

Next, referring to FIG. 3B, the second conductive line 266 filling the inside of the first trench T and the first via holes H may be formed. A planarization process may be performed so that the upper surface of the second insulating layer 240 is exposed. A third insulating barrier layer 267 and a third insulating layer 270 covering the second insulating layer 240 and the second wiring 260 may be sequentially formed.

As set forth above, a semiconductor device having improved reliability may be provided by forming a resistive structure including an etch-stop layer.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   a first insulating layer disposed on a substrate;
   a first wiring disposed in the first insulating layer;
   a first insulating barrier layer disposed on the first insulating layer;
   an etch-stop layer disposed on the first insulating barrier layer and having a planar area smaller than a planar area of the first insulating barrier layer;
   a resistive metal pattern disposed on the etch-stop layer;
   a second insulating barrier layer disposed on the resistive metal pattern;
   a second insulating layer covering the first insulating barrier layer and the second insulating barrier layer;
   a second wiring disposed in the second insulating layer; and
   a first conductive via disposed between the resistive metal pattern and the second wiring to penetrate through the second insulating barrier layer and the second insulating layer and electrically connect the resistive metal pattern and the second wiring.

2. The semiconductor device of claim 1, wherein a lower surface of the etch-stop layer contacts an upper surface of the first insulating barrier layer, and an upper surface of the etch-stop layer contacts a lower surface of the resistive metal pattern.

3. The semiconductor device of claim 1, wherein the etch-stop layer comprises a metal oxide containing aluminum (Al).

4. The semiconductor device of claim 3, wherein the etch-stop layer further comprises at least one of nitrogen (N), carbon (C), zirconium (Zr), ruthenium (Ru), lanthanum (La), and hafnium (Hf).

5. The semiconductor device of claim 1, wherein the second wiring has a region in which a thickness in a vertical direction of the second wiring decreases in a horizontal direction approaching the first conductive via.

6. The semiconductor device of claim 1, wherein the second insulating layer covers side surfaces of the etch-stop layer, the resistive metal pattern, and the second insulating barrier layer.

7. The semiconductor device of claim 1, wherein the second insulating layer has a first surface in contact with a lower surface of the second wiring, and
the first surface of the second insulating layer has a curved region above a side surface of the etch-stop layer.

8. The semiconductor device of claim 1, wherein the first insulating barrier layer has a first thickness in a vertical direction,
the etch-stop layer has a second thickness in the vertical direction less than the first thickness, and
the resistive metal pattern has a third thickness in the vertical direction that is less than the first thickness and greater than the second thickness.

9. The semiconductor device of claim 1, wherein each of a thickness of the first insulating barrier layer and a thickness of the second insulating barrier layer in a vertical direction is less than about 100 Å,
a thickness of the etch-stop layer in the vertical direction is less than about 30 Å, and
a thickness of the resistive metal pattern in the vertical direction is less than about 45 Å.

10. The semiconductor device of claim 1, wherein the etch-stop layer covers an upper surface of the first insulating barrier layer, a side surface of the resistive metal pattern, and a side surface and an upper surface of the second insulating barrier layer.

11. The semiconductor device of claim 1, wherein the second wiring extends in a first direction, and
the first wiring extends in a second direction perpendicular to the first direction.

12. The semiconductor device of claim 1, wherein at least one of the first and second insulating barrier layers comprises two or more layers stacked in a vertical direction.

13. The semiconductor device of claim 1, further comprising a capping layer covering an upper surface of the first wiring, between the first wiring and the first insulating barrier layer.

14. A semiconductor device comprising:
a first wiring disposed on a substrate;
a first insulating barrier layer disposed on the first wiring;
a resistive structure disposed on the first insulating barrier layer and including a resistive metal pattern;
an insulating layer disposed on the resistive structure;
a second wiring disposed in the insulating layer; and
a first conductive via penetrating through the insulating layer and electrically connecting the second wiring and the resistive metal pattern,
wherein the resistive structure includes,
an etch-stop layer disposed between the first insulating barrier layer and the resistive metal pattern, having an area smaller than an area of the first insulating barrier layer in a plan view, and having a thickness in a vertical direction less than a thickness of the resistive metal pattern in the vertical direction; and
a second insulating barrier layer disposed on the resistive metal pattern and penetrated by the first conductive via.

15. The semiconductor device of claim 14, wherein a lower surface of the etch-stop layer contacts an upper surface of the first insulating barrier layer, and an upper surface of the etch-stop layer contacts a lower surface of the resistive metal pattern.

* * * * *